(12) United States Patent
Choi et al.

(10) Patent No.: US 9,343,629 B2
(45) Date of Patent: May 17, 2016

(54) LIGHT EMITTING DEVICE

(71) Applicant: LG INNOTEK CO., LTD., Seoul (KR)

(72) Inventors: Byungyeon Choi, Seoul (KR);
Hyunseoung Ju, Seoul (KR);
Yonggyeong Lee, Seoul (KR); Giseok Hong, Seoul (KR); Jihee No, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/288,227

(22) Filed: May 27, 2014

(65) Prior Publication Data

US 2014/0264421 A1 Sep. 18, 2014

Related U.S. Application Data

(63) Continuation of application No. 13/412,786, filed on Mar. 6, 2012.

(30) Foreign Application Priority Data

Nov. 15, 2011 (KR) .......................... 10-2011-0119144

(51) Int. Cl.
*H01L 31/00* (2006.01)
*H01L 33/40* (2010.01)
*H01L 33/38* (2010.01)

(52) U.S. Cl.
CPC .............. *H01L 33/405* (2013.01); *H01L 33/38* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 2010/0051994 A1 | 3/2010 | Katsuno et al. | |
| 2010/0065867 A1* | 3/2010 | Unno | H01L 33/0079 257/98 |
| 2010/0163895 A1 | 7/2010 | Horie | |
| 2010/0163901 A1 | 7/2010 | Fudeta | |
| 2010/0163903 A1* | 7/2010 | Shim | H01L 33/22 257/98 |
| 2011/0018022 A1 | 1/2011 | Okabe et al. | |
| 2011/0049472 A1* | 3/2011 | Kim | H01L 33/465 257/13 |
| 2012/0049232 A1* | 3/2012 | Okabe | H01L 33/38 257/98 |
| 2012/0235204 A1 | 9/2012 | Hodota et al. | |

FOREIGN PATENT DOCUMENTS

| | | |
|---|---|---|
| EP | 2028699 A2 | 2/2009 |
| JP | 2006-245231 A | 9/2006 |
| WO | WO 2010/131458 A1 | 11/2010 |

* cited by examiner

*Primary Examiner* — Ali Naraghi
(74) *Attorney, Agent, or Firm* — Birch, Stewart, Kolasch & Birch, LLP

(57) ABSTRACT

A light emitting device including a light emitting structure having a first semiconductor layer, a second semiconductor layer, and an active layer between the first and second semiconductor layers; a first electrode electrically connected to the first semiconductor layer; and a second electrode disposed on the second semiconductor layer. Further, the second electrode include a reflective layer disposed on the second semiconductor layer; a metal layer disposed on a side surface of the reflective layer and on a top surface of reflective layer; a first anti-oxidation layer on the metal layer; and a second anti-oxidation layer on the first anti-oxidation layer. In addition, the second anti-oxidation layer is more than 10 times thicker than the first anti-oxidation layer.

17 Claims, 24 Drawing Sheets

500

LIGHT EMITTING DEVICE

CROSS-REFERENCE TO RELATED APPLICATIONS

This application is a Continuation of co-pending U.S. patent application Ser. No. 13/412,786 filed Mar. 6, 2012, which claims priority to Korean Patent Application No. 10-2011-0119144, filed in the Republic of Korea on Nov. 15, 2011, the entire contents of all of the above applications are hereby incorporated by reference.

BACKGROUND OF THE INVENTION

1. Field of the Invention

Embodiments relate to a light emitting device.

2. Discussion of the Related Art

Light Emitting Diodes (LEDs) are representative of light emitting devices, and refer to devices which convert electrical signals into light such as infrared light or visible light using characteristics of compound semiconductors. Such LEDs are being utilized in home appliances, remote controllers, electronic displays, displays and various other automated machines, and the application range thereof is gradually increasing.

In General, miniature LEDs are fabricated into surface mount devices so as to be directly mounted on a Printed Circuit Board (PCB), and hence, LED lamps, which serve as display devices, are being developed into surface mount devices. The surface mount devices can substitute for conventional simple lamps and are used in a variety of color on-and-off displays and character displays and image displays.

As the application range of LEDs is broad, household lamps, distress signal lamps, or the like require high luminance. Therefore, luminance of the LEDs needs to be increased.

SUMMARY OF THE INVENTION

Embodiments provide a light emitting device including an electrode, which has a superior bonding property to a semiconductor layer and has high light reflectivity.

In one embodiment, a light emitting device includes a light emitting structure including a first semiconductor layer, a second semiconductor layer, and an active layer between the first and second semiconductor layers, a first electrode electrically connected to the first semiconductor layer, and a second electrode disposed over the second semiconductor layer, wherein the second electrode includes a reflective electrode layer disposed over the second semiconductor layer, and a bonding electrode layer disposed in at least a partial region of an outer side surface of the reflective electrode layer while coming into contact with the second semiconductor layer.

BRIEF DESCRIPTION OF THE DRAWINGS

Details of embodiments will be more clearly understood from the following detailed description taken in conjunction with the accompanying drawings, in which.

DETAILED DESCRIPTION OF THE INVENTION

Figure 1:
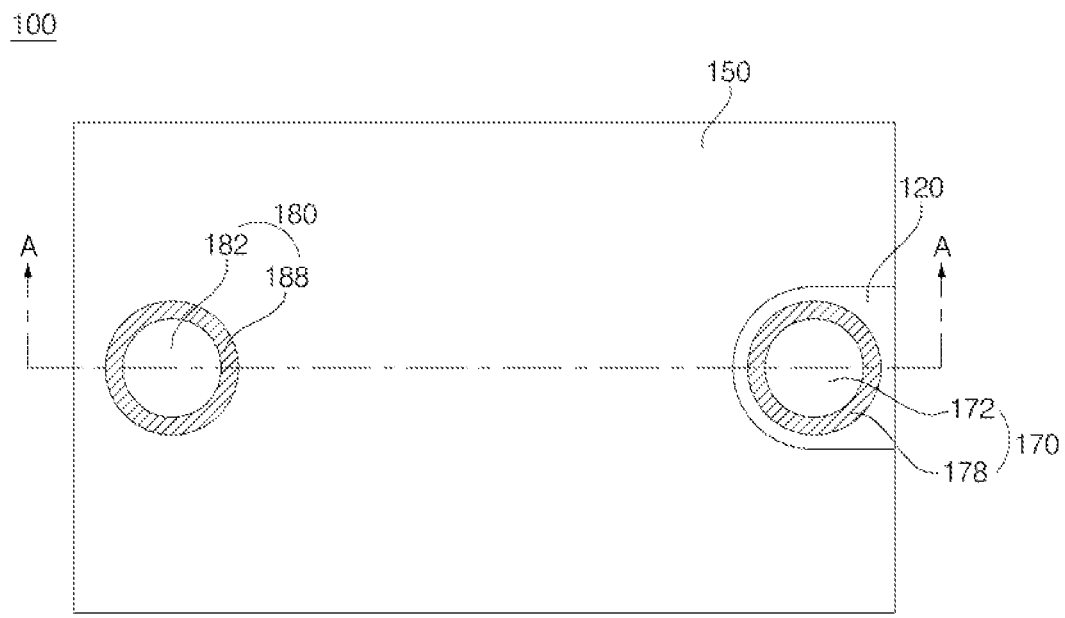
FIG. 1 is a top view illustrating a light emitting device according to an exemplary embodiment.

Reference will now be made in detail to embodiments, examples of which are illustrated in the accompanying drawings. However, the present disclosure may be embodied in many different forms and should not be construed as limited to the embodiments set forth herein.

Rather, these embodiments are provided so that this disclosure will be thorough and complete, and will fully convey the scope of the disclosure to those skilled in the art. The present disclosure is defined only by the categories of the claims. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Figure 2:
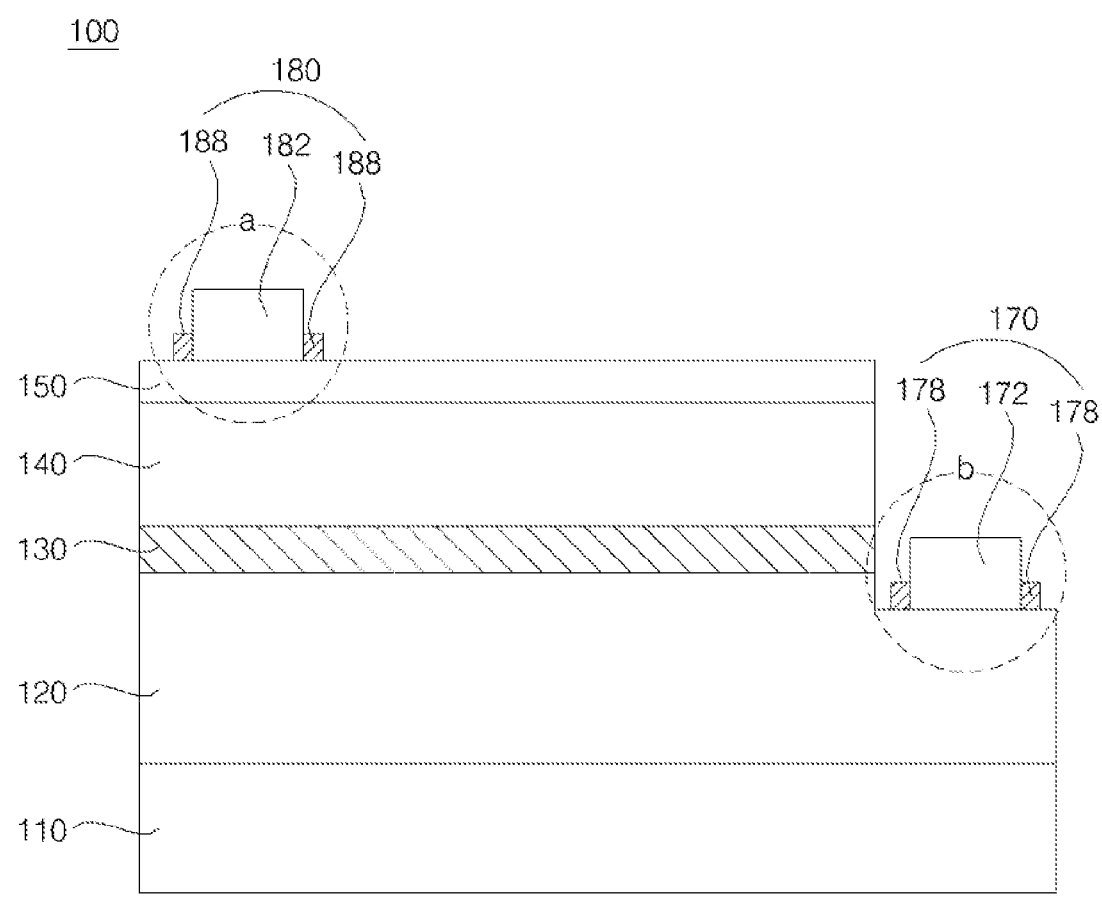
FIG. 2 is a sectional view taken along line A-A of the light emitting device shown in FIG. 1.
Figure 3:
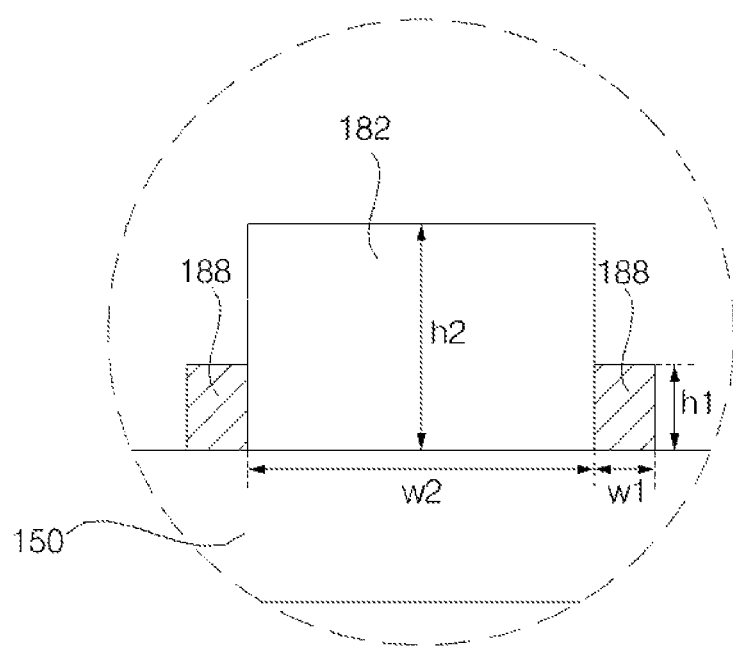
FIG. 3 is an enlarged view illustrating region "a" of FIG. 2.
Figure 4:
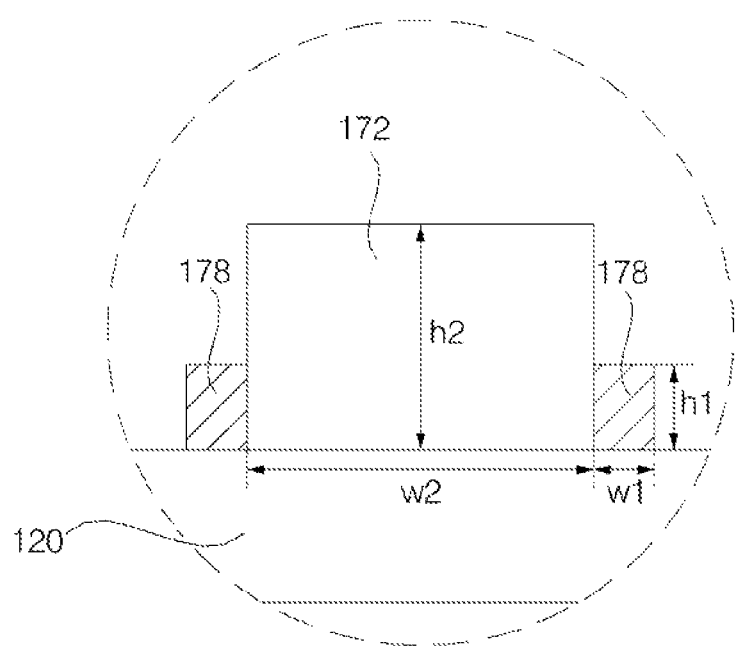
FIG. 4 is an enlarged view illustrating region "b" of FIG. 2.

FIG. 1 is a top view illustrating a light emitting device according to an exemplary embodiment. FIG. 2 is a sectional view taken along line A-A of the light emitting device shown in FIG. 1. FIG. 3 is an enlarged view illustrating region "a" of FIG. 2. FIG. 4 is an enlarged view illustrating region "b" of FIG. 2.

Referring to FIGS. 1 to 4, the light emitting device, which is designated by reference numeral 100, according to the illustrated embodiment may largely include a support member 110, a light emitting structure, and an electrode. The light emitting structure may include a first semiconductor layer 120, a second semiconductor layer 140, and an active layer 130 between the first and second semiconductor layers 120 and 140.

The support member 110 may be made of any one of materials having light transmittance, for example, sapphire ($Al_2O_3$), GAN, ZnO, and AlO, but the present disclosure is not limited thereto. Also, the support member 110 may be a support member made of silicon carbide (SiC) having higher thermal conductivity than the sapphire ($Al_2O_3$) support member. However, the support member 110 preferably has a lower refractive index than the first semiconductor layer 120 in order to enhance light extraction efficiency.

Meanwhile, the support member 110 may be formed, at a lower surface thereof, with a surface irregularity pattern to enhance light extraction efficiency.

The surface irregularity pattern may be formed at a surface opposed to the surface at which the light emitting structure is formed, and be formed using an etching method. For example, a dry etching method or a wet etching method may be used, but the present disclosure is not limited thereto. In accordance with the surface irregularity pattern, it may be possible to prevent total reflection of light, and thus to achieve an enhancement in light extraction efficiency.

Meanwhile, a buffer layer (not shown) may be disposed on the support member 110, to reduce lattice misalignment between the support member 110 and the first semiconductor layer 120 while enabling easy growth of the semiconductor layer. The buffer layer (not shown) may be formed in a lower temperature mode, and be made of a material capable of reducing a difference in lattice constants between the semiconductor layer and the support member. For example, the buffer layer may be made of a material selected from GaN, InN, AlN, AlInN, InGaN, AlGaN, and InAlGaN, but the present disclosure is not limited thereto.

The light emitting structure, which includes the first semiconductor layer 120, the active layer 130, and the second semiconductor layer 140, may be formed on the buffer layer (not shown).

The first semiconductor layer 120 may be disposed on the buffer layer (not shown). The first semiconductor layer 120 may be implemented as an n-type semiconductor layer, and may supply electrons to the active layer 130. The first semiconductor layer 120 may be made of, for example, a semiconductor material having a formula of $In_xAl_yGa_{1-x-y}N$ ($0 \le x \le 1$, $0 \le y \le 1$, and $0 \le x+y \le 1$). For example, the first semiconductor layer 120 may be made of a semiconductor material selected from GaN, AlN, AlGaN, InGaN, InN, InAlGaN, AlInN, and the like, and may be doped with an n-type dopant such as Si, Ge, Sn, or the like.

The first semiconductor layer 120 may further include an undoped semiconductor layer (not shown) disposed beneath the first semiconductor layer 120, but the present disclosure is not limited thereto. The undoped semiconductor layer refers to a layer formed to enhance crystalizability of the first semiconductor layer 120, and is not doped with the n-type dopant. Accordingly, the undoped semiconductor layer may be equal to the first semiconductor layer 120, except for having lower electrical conductivity than the first semiconductor layer 120.

The active layer 130 may be formed on the first semiconductor layer 120. The active layer 130 may have a single quantum well structure, a multi quantum well (MQW) structure, a quantum wire structure, a quantum dot structure, or the like, which is formed using a Group III-V compound semiconductor material.

When the active layer 130 has the quantum well structure, the active layer 130, for example, may have the single or multi quantum well structure, which includes a well layer having a formula of $In_xAl_yGa_{1-x-y}N$ ($0 \le x \le 1$, $0 \le y \le 1$, and $0 \le x+y \le 1$) and a barrier layer having a formula of $In_aAl_bGa_{1-a-b}N$ ($0 \le a \le 1$, $0 \le b \le 1$, and $0 \le a+b \le 1$). The well layer may be made of a material having a band gap smaller than a band gap of the barrier layer.

A conductive clad layer (not shown) may be formed over and/or beneath the active layer 130. The conductive clad layer (not shown) may be made of an AlGaN-based semiconductor and have a greater band gap than the active layer 130.

The second semiconductor layer 140 may be implemented as a p-type semiconductor layer so as to inject holes into the active layer 130. The second semiconductor layer 140 may be made of a semiconductor material having a formula of $In_xAl_yGa_{1-x-y}N$ ($0 \le x \le 1$, $0 \le y \le 1$, and $0 \le x+y \le 1$). For example, the second semiconductor layer 140 may be made of a semiconductor material selected from GaN, AlN, AlGaN, InGaN, InN, InAlGaN, AlInN, and the like, and may be doped with a p-type dopant such as Mg, Zn, Ca, Sr, Ba, or the like.

Meanwhile, an intermediate layer (not shown) may be formed between the active layer 130 and the second semiconductor layer 140. The intermediate layer may be an electron blocking layer to prevent electrons injected from the first semiconductor layer 120 to the active layer 130 during application of high current from flowing to the second semiconductor layer 140, without recombination of the electrons in the active layer 130. The intermediate layer has a relatively greater band gap than the active layer 130, thereby preventing electrons injected from the first semiconductor layer 120 from being injected into the second semiconductor layer 140, without recombination of the electrons in the active layer 130. Thus, it may be possible to enhance recombination probability between the electrons and the holes in the active layer 130 and to prevent leakage of current.

Here, the intermediate layer may have a greater band gap than the band gap of the barrier layer included in the active layer 130, and be formed as a semiconductor layer containing aluminum (Al) such as p-type AlGaN. However, the intermediate layer is not limited to the above-mentioned configuration.

The above-mentioned first semiconductor layer 120, active layer 130, and second semiconductor layer 140 may be formed, for example, using metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or sputtering, but the present disclosure is not limited thereto.

Also, the conductive dopant in each of the first and second semiconductor layers 120 and 140 may have a uniform or non-uniform doping concentration. That is, a plurality of semiconductor layers may be formed to have various doping concentration distributions, but the present disclosure is not limited thereto.

In addition, the first semiconductor layer 120 may be implemented as a p-type semiconductor layer, the second semiconductor layer 140 may be implemented as an n-type semiconductor layer, and a third semiconductor layer (not shown), which includes an n-type or p-type semiconductor layer, may also be formed on the second semiconductor layer 140. Thus, the light emitting device 100 may have at least one of an n-p junction structure, a p-n junction structure, an n-p-n junction structure, and a p-n-p junction structure.

The electrode serves to connect the light emitting device 100 to a power source. The electrode may include a first electrode 170 electrically connected to the first semiconductor layer 120 and a second electrode 180 disposed over the second semiconductor layer 140. A light transmitting electrode layer 150 may be formed between the second electrode 180 and the second semiconductor layer 140.

The light transmitting electrode layer 150 may be made of at least one of ITO, IZO(In—ZnO), GZO(Ga—ZnO), AZO (Al—ZnO), AGZO(Al—GaZnO), IGZO(In—GaZnO), $IrO_x$, $RuO_x$, $RuO_x$/ITO, Ni/$IrO_x$/Au, and Ni/$IrO_x$/Au/ITO. The light transmitting electrode layer 150 may be formed throughout one surface of an outer side of the second semiconductor layer 140, thereby preventing a current crowding phenomenon.

The first electrode 170 may be formed on the first semiconductor layer 120. The first electrode 170 is not limited to a formation position thereof, and a plurality of first electrodes may also be formed, taking into consideration a size or the like of the light emitting device 100. Furthermore, partial regions of the second semiconductor layer 140 and active layer 130 are removed, a portion of the first semiconductor layer 120 is exposed, and the first electrode 170 may be formed on the exposed upper surface of the first semiconductor layer 120, as shown in FIG. 2. However, the present disclosure is not limited to the above-mentioned configuration. For example, the support member 110 is removed, and the first electrode 170 may also be formed on the exposed surface of the first semiconductor layer 120.

The first semiconductor layer 120 is not limited to a method removing the upper surface thereof, and, for example, a wet etching method, a dry etching method, and the like may be used.

The second electrode 180 may be disposed over the second semiconductor layer 140.

Again referring to FIGS. 1 to 3, the second electrode 180 may include a reflective electrode layer 182 disposed over the second semiconductor layer 140, and a bonding electrode layer 188, which is disposed in at least a partial region of an outer side surface of the reflective electrode layer 182 while coming into contact with the second semiconductor layer 140.

The reflective electrode layer 182 may be connected to the second semiconductor layer 140. When viewed from the top, the reflective electrode layer 182 may have various shapes such as a circular shape, a triangular shape, a square shape, and the like. Although the reflective electrode layer 182 is illustrated as having a circular shape in FIG. 1, the present disclosure is not limited thereto. In addition, the reflective electrode layer 182 may have a stepped or inclined form in section. However, the reflective electrode layer 182 is not limited to the above-mentioned configuration, and the description thereof will be given later.

The reflective electrode layer 182 may contain a metal exhibiting a reflective material. For example, the reflective electrode layer 182 may contain any one selected from the group consisting of aluminum (Al), rhodium (Rh), tin (Sn), silver (Ag), a silver-based alloy, and a silver-based oxide. Also, the reflective electrode layer 182 may have a single layer structure or a multi layer structure, but the present disclosure is not limited thereto.

The bonding electrode layer 188 may be connected, at a lower surface thereof, to the second semiconductor layer 140, and be disposed at the partial region of or throughout the outer side surface of the reflective electrode layer 182. That is, the bonding electrode layer 188 may be formed to enclose a portion of or throughout the outer side surface of the reflective electrode layer 182, and the lower surface of the bonding electrode layer 188 may be formed to come into contact with the second semiconductor layer 140. The bonding electrode layer 188 is not limited to a shape thereof, and, for example, may have various shapes. The description thereof will be given later.

The bonding electrode layer 188 may have a single layer structure or a multi layer structure, and may contain a material having a superior bonding force to the second semiconductor layer 140. For example, the bonding electrode layer 188 may contain any one of chromium (Cr) and titanium (Ti), but the present disclosure is not limited thereto.

The bonding electrode layer 188 may have the multi layer structure, and at least, for example, a chromium (Cr) layer, an aluminum (Al) layer, a nickel (Ni) layer, and a gold (Au) layer are laminated on the bonding electrode layer 188 in this order. The Cr layer may be disposed to come into contact with an upper surface of the second semiconductor layer 140. Also, the layers may be repeatedly laminated in the above-mentioned order. Although the bonding electrode layer 188 is not limited to a thickness thereof, the Cr layer may have a thickness of 15 Å to 25 Å, the Al layer may have a thickness of 2800 Å to 3200 Å, the Ni layer may have a thickness of 400 Å to 600 Å, and the Au layer may have a thickness of 7500 Å to 8500 Å. Since, A heat treatment process is proceeded after Al is laminated and Cr (conventional electrode) is laminated after the heat treatment process, it may be possible to enhance reflectivity of electrode, thereby enhancing light extraction efficiency of the light emitting device. Since the workfunction of Al is 4.28 and the workfunction of Cr is 4.5, it may be possible to achieve an enhancement in electrical characteristics.

As such, when the reflective electrode layer 182 is disposed and the bonding electrode layer 188 is disposed at the outer side surface of the reflective electrode layer 182, it may be possible to prevent peeling-off of the reflective electrode layer 182 due to weak bonding force between the second semiconductor layer 140 and the reflective electrode layer 182. At the same time, since light emitted from the active layer 130 is reflected by the reflective electrode layer 182, it may be possible to prevent light absorption by virtue of the second electrode 180.

The above-mentioned description will be given again with reference to Table 1 below. The following Table 1 represents a result with respect to a reflectivity experiment between the conventional electrode and the electrode according to the illustrated embodiment. The conventional electrode has a structure in which a bonding electrode layer, a reflective electrode layer, and an anti-oxidation layer are laminated in this order. On the other hand, Example 1 refers to an electrode structure according to the illustrated embodiment, and the case in which a width ratio of the reflective electrode layer 182 to the bonding electrode layer 188 is 10:1. Example 2 refers to an electrode structure according to the illustrated embodiment, and the case in which a width ratio of the reflective electrode layer 182 to the bonding electrode layer 188 is 10:4. In accordance with this result, it may be possible to achieve an enhancement in reflectivity of about 5% or more through the electrode structure of the light emitting device 100 according to the illustrated embodiment while maintaining bonding force between the electrode and the semiconductor layer.

TABLE 1

| | Reflectivity (%) (at 450 nm) |
| --- | --- |
| Conventional Art | 84.45 |
| Example 1 | 89.60 |
| Example 2 | 88.58 |

Meanwhile, the bonding electrode layer 188 may have a width and a thickness capable of enclosing the outer side surface of the reflective electrode layer 182.

When the bonding electrode layer 188 has an overly thick thickness h1, an area capable of absorbing light emitted from the active layer 130 is increased, whereas when the bonding electrode layer 188 has an overly thin thickness h1, bonding force between the reflective electrode layer 182 and the bonding electrode layer 188 is deteriorated. Therefore, the bonding electrode layer 188 may have a thickness of 300 nm to 500 nm. Alternatively, the thickness h1 of the bonding electrode layer 188 may be 0.2 to 1 times the thickness h2 of the reflective electrode layer 182, but the present disclosure is not limited thereto.

When the bonding electrode layer 188 has an overly high width w1, an area capable of absorbing light emitted from the active layer 130 is increased, whereas when the bonding electrode layer 188 has an overly small width w1, bonding force between the reflective electrode layer 182 and the second semiconductor layer 140 is deteriorated. Therefore, the bonding electrode layer 188 may have a width of 1 μm to 2 μm. Alternatively, the width w1 of the bonding electrode layer 188 may be 0.1 to 0.5 times the width w2 of the reflective electrode layer 182, but the present disclosure is not limited thereto.

Again referring to FIG. 4, the first electrode 170 may include a reflective electrode layer 172 disposed on the first semiconductor layer 120, and a bonding electrode layer 178, which is disposed in at least a partial region of an outer side surface of the reflective electrode layer 172 while coming into contact with the first semiconductor layer 120.

The reflective electrode layer 172 may be connected to the first semiconductor layer 120. When viewed from the top, the reflective electrode layer 172 may have various shapes such as a circular shape, a triangular shape, a square shape, and the like. Although the reflective electrode layer 172 is illustrated as having a circular shape in FIG. 1, the present disclosure is not limited thereto. In addition, the reflective electrode layer 172 may have a stepped or inclined form in section. However, the reflective electrode layer 172 is not limited to the above-mentioned configuration, and the description thereof will be given later.

The reflective electrode layer 172 may contain a metal exhibiting a reflective material. For example, the reflective electrode layer 172 may contain any one selected from the group consisting of aluminum (Al), rhodium (Rh), tin (Sn), silver (Ag), a silver-based alloy, and a silver-based oxide. Also, the reflective electrode layer 172 may have a single layer structure or a multi layer structure, but the present disclosure is not limited thereto.

The bonding electrode layer 178 may be connected, at a lower surface thereof, to the first semiconductor layer 120, and be disposed at the partial region of or throughout the outer side surface of the reflective electrode layer 172. That is, the bonding electrode layer 178 may be formed to enclose a portion of or throughout the outer side surface of the reflective electrode layer 172, and the lower surface of the bonding electrode layer 178 be formed to come into contact with the first semiconductor layer 120. The bonding electrode layer 178 is not limited to a shape thereof, and, for example, may have various shapes. The description thereof will be given later.

The bonding electrode layer 178 may contain a material having a superior bonding force to the first semiconductor layer 120. For example, the bonding electrode layer 178 may contain any one of chromium (Cr) and titanium (Ti), but the present disclosure is not limited thereto.

As such, when the reflective electrode layer 172 is disposed and the bonding electrode layer 178 is disposed at the outer side surface of the reflective electrode layer 172, it may be possible to prevent peeling-off of the reflective electrode layer 172 due to weak bonding force between the first semiconductor layer 120 and the reflective electrode layer 172. At the same time, since light emitted from the active layer 130 is reflected by the reflective electrode layer 172, it may be possible to prevent light absorption by virtue of the first electrode 170.

Meanwhile, the bonding electrode layer 178 may have a width and a thickness capable of enclosing the outer side surface of the reflective electrode layer 172.

When the bonding electrode layer 178 has an overly thick thickness h1, an area capable of absorbing light emitted from the active layer 130 is increased, whereas when the bonding electrode layer 178 has an overly thin thickness h1, bonding force between the reflective electrode layer 172 and the bonding electrode layer 178 is deteriorated. Therefore, the bonding electrode layer 178 may have a thickness of 300 nm to 500 nm. Alternatively, the thickness h1 of the bonding electrode layer 178 may be 0.2 to 1 times the thickness h2 of the reflective electrode layer 172, but the present disclosure is not limited thereto.

When the bonding electrode layer 178 has an overly high width w1, an area capable of absorbing light emitted from the active layer 130 is increased, whereas when the bonding electrode layer 178 has an overly small width w1, bonding force between the reflective electrode layer 172 and the first semiconductor layer 120 is deteriorated. Therefore, the bonding electrode layer 178 may have a width of 1 μm to 2 μm. Alternatively, the width w1 of the bonding electrode layer 178 may be 0.1 to 0.5 times the width w2 of the reflective electrode layer 172, but the present disclosure is not limited thereto.

Hereinafter, the following description will be given in conjunction with the second electrode 180. Since the first electrode 170 is similar to the second electrode 180, unless otherwise specifically mentioned, no description will be given thereof.

Figure 5:
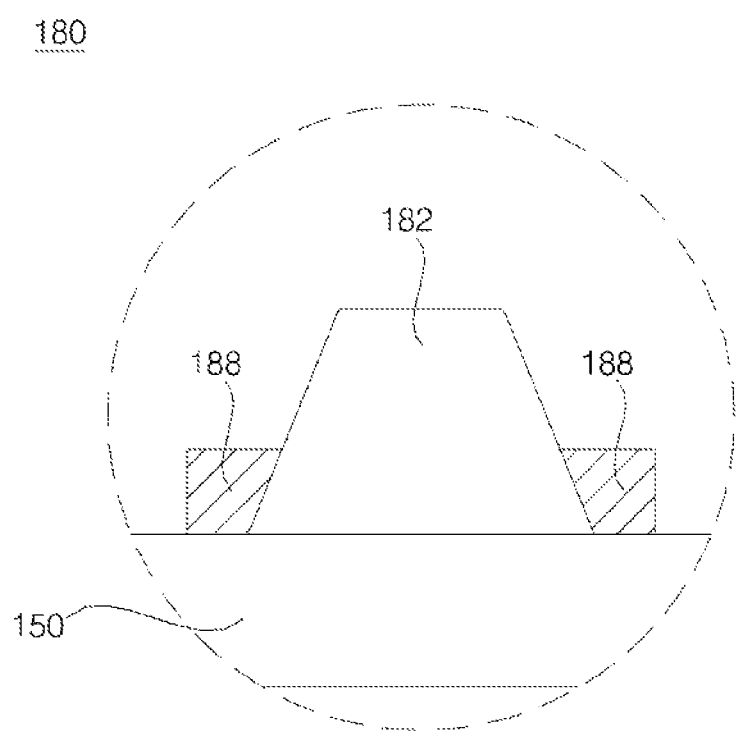
FIG. 5 is a sectional view illustrating an electrode of a light emitting device according to another embodiment.

FIG. 5 is a sectional view illustrating an electrode of a light emitting device according to another embodiment.

Referring to FIG. 5, the light emitting device, which is designated by reference numeral 100, according to the illustrated embodiment includes a first electrode 170 and a second electrode 180 having a different structure than the embodiment illustrated in FIG. 1.

The second electrode 180 may include a reflective electrode layer 182 and a bonding electrode layer 188, and the reflective electrode layer 182 may have a decreasing width with decreasing distance to an upward direction. That is, the reflective electrode layer 182 may have an inclined surface at a side surface thereof. In this case, the bonding electrode layer 188 may be formed along the inclined surface of the reflective electrode layer 182.

As such, when the reflective electrode layer 182 has the decreasing width with decreasing distance to the upward direction, an area to reflect light emitted from the active layer 130 may be increased and bonding force between the reflective electrode layer 182 and the bonding electrode layer 188 may be increased. Thus, it may further be possible to prevent peeling-off of the reflective electrode layer 182 from the semiconductor layer.

The first electrode 170 may have the same structure as the second electrode 180.

Figure 6:
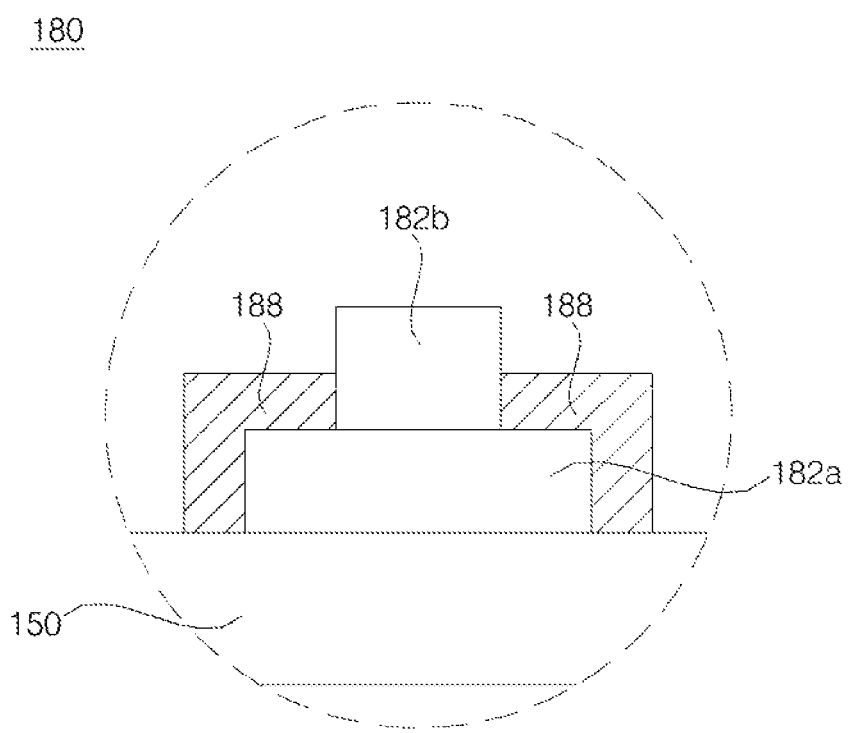
FIG. 6 is a sectional view illustrating an electrode of a light emitting device according to a further embodiment.

FIG. 6 is a sectional view illustrating an electrode of a light emitting device according to a further embodiment.

Referring to FIG. 6, the light emitting device, which is designated by reference numeral 100, according to the illustrated embodiment includes a first electrode 170 and a second electrode 180 having a different structure than the embodiment illustrated in FIG. 1.

The second electrode 180 may include a reflective electrode layer 182 and a bonding electrode layer 188. The reflective electrode layer 182 may include a first reflective electrode layer 182a formed to have a height equal to the bonding electrode layer 188 and a second reflective electrode layer 182b, which is disposed on the first reflective electrode layer 182a while having a width smaller than the first reflective electrode layer 182a. The bonding electrode layer 188 may be disposed from a side surface of the first reflective electrode layer 182a along an upper surface of the first reflective electrode layer 182a up to a partial region of a side surface of the second reflective electrode layer 182b. That is, the reflective electrode layer 182 may have a stepped form at the side surface thereof, and the bonding electrode layer 188 may be formed along the stepped form of the reflective electrode layer 182.

Thus, an area to reflect light emitted from the active layer 130 may be increased, and a contact area between the reflective electrode layer 182 and the bonding electrode layer 188 may be increased. Consequently, it may further be possible to prevent peeling-off of the reflective electrode layer 182 from the semiconductor layer.

The first electrode 170 may have the same structure as the second electrode 180.

Figure 7:
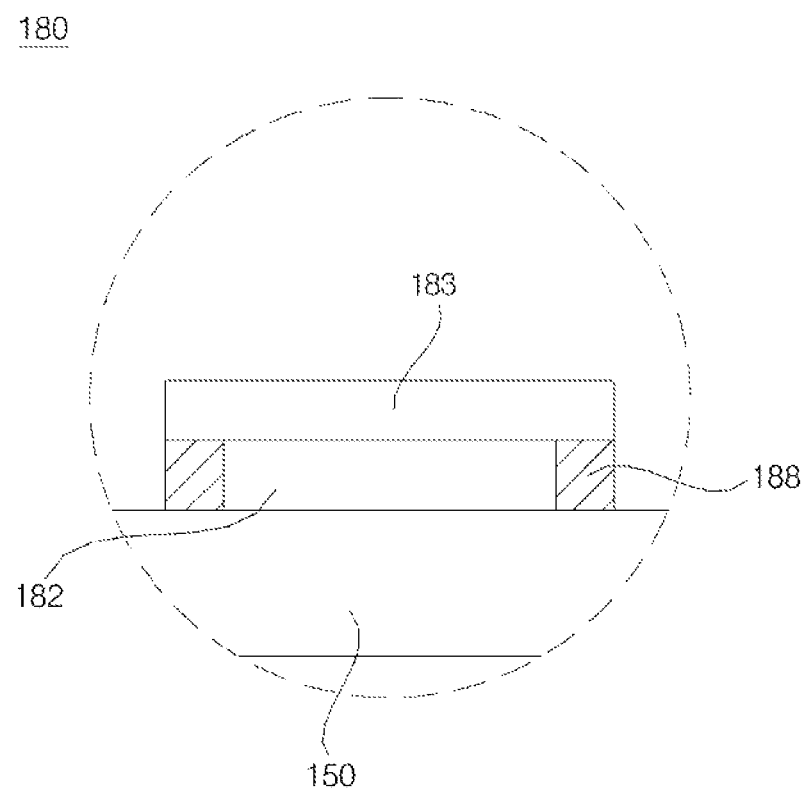
FIG. 7 is a sectional view illustrating an electrode of a light emitting device according to yet another embodiment.

FIG. 7 is a sectional view illustrating an electrode of a light emitting device according to yet another embodiment.

Referring to FIG. 7, the light emitting device, which is designated by reference numeral 100, according to the illustrated embodiment includes a first electrode 170 and a second electrode 180 having a different structure than the embodiment illustrated in FIG. 1.

The second electrode 180 may include a reflective electrode layer 182 and a bonding electrode layer 188, and may further include a protective layer 183 disposed on the reflective electrode layer 182 and/or the bonding electrode layer 188.

The protective layer 183 may contain nickel (Ni).

Figure 8:
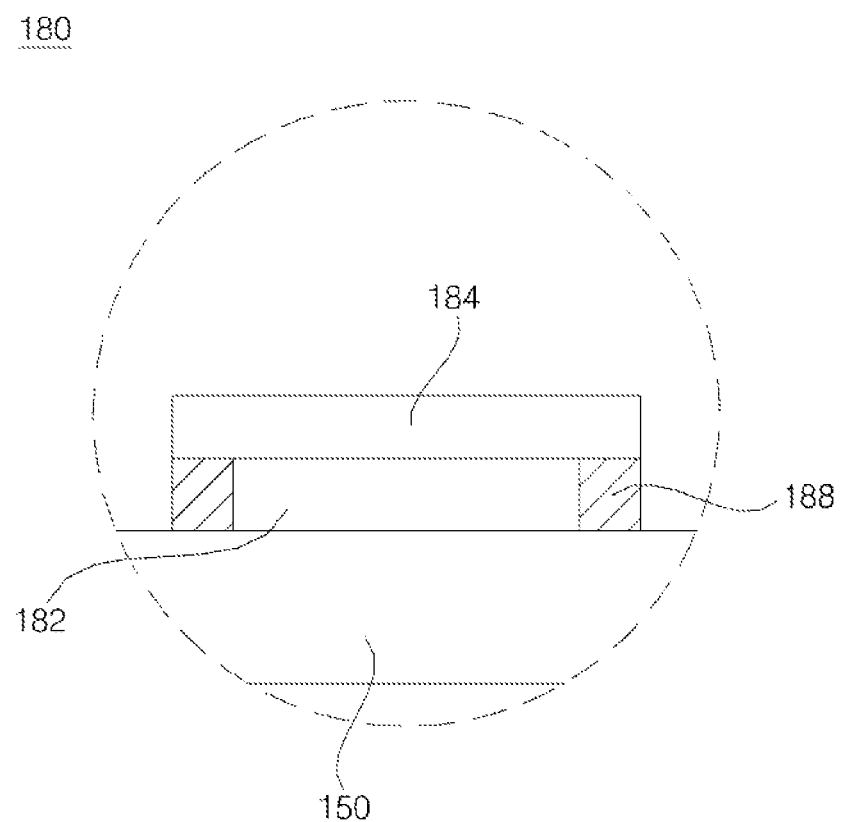
FIG. 8 is a sectional view illustrating an electrode of a light emitting device according to yet another embodiment.

FIG. 8 is a sectional view illustrating an electrode of a light emitting device according to yet another embodiment.

Referring to FIG. 8, the light emitting device, which is designated by reference numeral 100, according to the illustrated embodiment includes a first electrode 170 and a second electrode 180 having a different structure than the embodiment illustrated in FIG. 1.

The second electrode 180 may include a reflective electrode layer 182 and a bonding electrode layer 188, and may further include an anti-oxidation electrode layer 184 disposed on the reflective electrode layer 182 and/or the bonding electrode layer 188.

The anti-oxidation electrode layer 184 is not limited to a shape thereof, and may be disposed to be vertically overlapped with the reflective electrode layer 182 and bonding electrode layer 188. The anti-oxidation electrode layer 184 serves to prevent oxidation of the reflective electrode layer 182 and bonding electrode layer 188.

The anti-oxidation electrode layer 184 may contain a conductive material having oxidation resistance. For example, the anti-oxidation electrode layer 184 may contain at least one of gold (Au), rhodium (Rh), palladium (Pd), copper (Cu), nickel (Ni), ruthenium (Ru), iridium (Ir), and platinum (Pt), but the present disclosure is not limited thereto.

Figure 9:
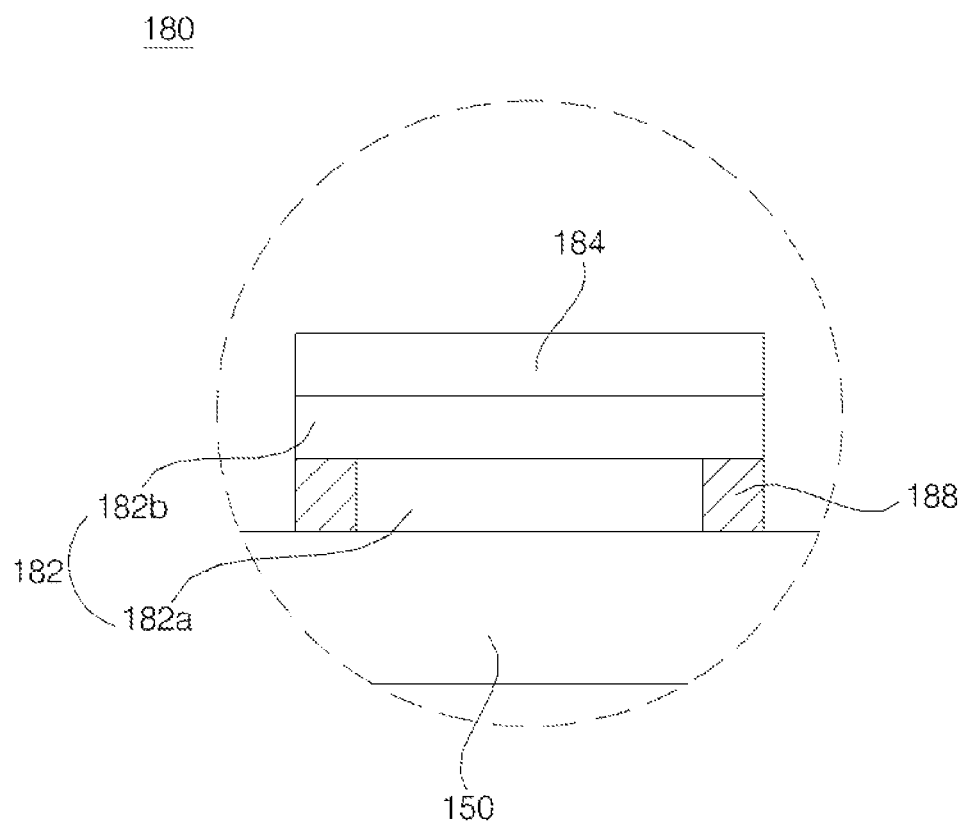
FIG. 9 is a sectional view illustrating an electrode of a light emitting device according to yet another embodiment.

FIG. 9 is a sectional view illustrating an electrode of a light emitting device according to yet another embodiment.

Referring to FIG. 9, the light emitting device, which is designated by reference numeral 100, according to the illustrated embodiment includes a first electrode 170 and a second electrode 180 having a different structure than the embodiment illustrated in FIG. 1.

The second electrode 180 may include a reflective electrode layer 182 and a bonding electrode layer 188. The reflective electrode layer 182 may include a first reflective electrode layer 182a formed to have a height equal to the bonding electrode layer 188 and a second reflective electrode layer 182b, which is disposed on the first reflective electrode layer 182a while being disposed up to an upper surface of the first reflective electrode layer 182a. Also, the second electrode 180 may further include an anti-oxidation electrode layer 184 disposed on the second reflective electrode layer 182b.

The anti-oxidation electrode layer 184 is not limited to a shape thereof, and may be disposed to be vertically overlapped with the reflective electrode layer 182 and bonding electrode layer 188. The anti-oxidation electrode layer 184 serves to prevent oxidation of the reflective electrode layer 182 and bonding electrode layer 188.

The anti-oxidation electrode layer 184 may contain a conductive material having oxidation resistance. For example, the anti-oxidation electrode layer 184 may contain at least one of gold (Au), rhodium (Rh), palladium (Pd), copper (Cu), nickel (Ni), ruthenium (Ru), iridium (Ir), and platinum (Pt), but the present disclosure is not limited thereto.

Figure 10:
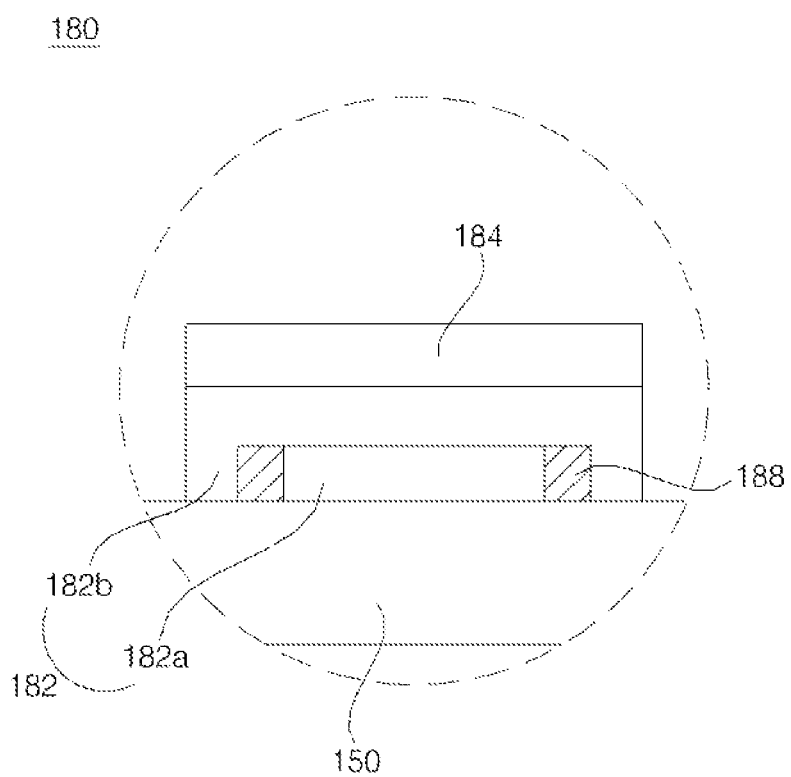
FIG. 10 is a sectional view illustrating an electrode of a light emitting device according to yet another embodiment.

FIG. 10 is a sectional view illustrating an electrode of a light emitting device according to yet another embodiment.

Referring to FIG. 10, the light emitting device, which is designated by reference numeral 100, according to the illustrated embodiment includes a second reflective electrode layer 182b having a different structure than the embodiment illustrated in FIG. 9.

The second reflective electrode layer 182b may be disposed to extend from an upper surface of the bonding electrode layer 188 to a side surface of the bonding electrode layer 188.

Figure 11:
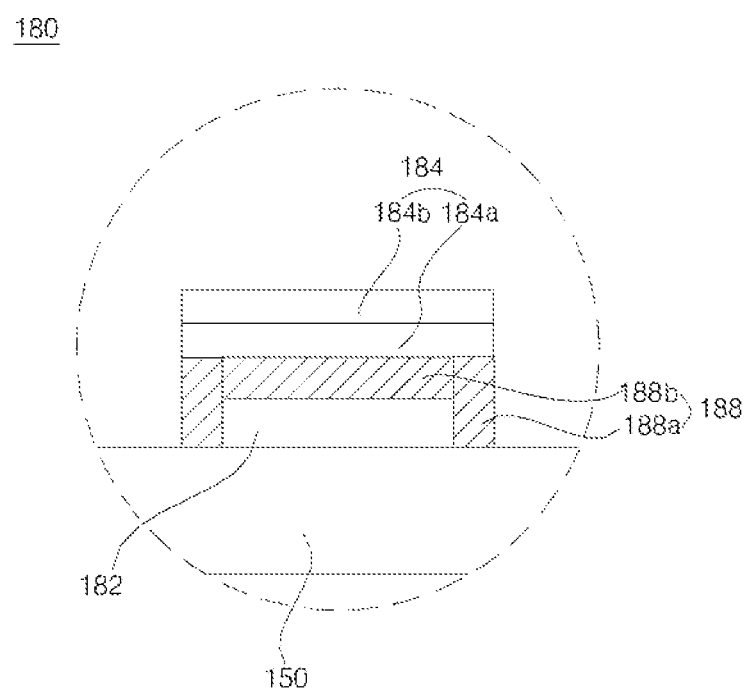
FIG. 11 is a sectional view illustrating an electrode of a light emitting device according to yet another embodiment.

Referring to FIG. 11, a light emitting device, which is designated by reference numeral 100, according to an illustrated embodiment includes a first electrode 170 and a second electrode 180 having a different structure than the embodiment illustrated in FIG. 1.

The second electrode 180 may include a reflective electrode layer 182 and a bonding electrode layer 188, and the bonding electrode layer 188 may have a greater height than the reflective electrode layer 182. Also, the bonding electrode layer 188 may be disposed to extend from a side surface of the reflective electrode layer 182 to an upper surface of the reflective electrode layer 182. That is, the bonding electrode layer 188 may include a first bonding electrode layer 188a disposed at the side surface of the reflective electrode layer 182 and a second bonding electrode layer 188b disposed on the reflective electrode layer 182.

In this case, the reflective electrode layer 182 may have a thickness of 200 nm to 500 nm.

The second electrode 180 may further include an anti-oxidation electrode layer 184 disposed on the second bonding electrode layer 188b.

The anti-oxidation electrode layer 184 is not limited to a shape thereof, and serves to prevent oxidation of the reflective electrode layer 182 and bonding electrode layer 188.

The anti-oxidation electrode layer 184 may contain a conductive material having oxidation resistance. For example, the anti-oxidation electrode layer 184 may contain at least one of gold (Au), rhodium (Rh), palladium (Pd), copper (Cu), nickel (Ni), ruthenium (Ru), iridium (Ir), and platinum (Pt), but the present disclosure is not limited thereto.

The anti-oxidation electrode layer 184 illustrated in FIG. 11 may include a first anti-oxidation electrode layer 184a made of nickel (Ni) or the like, and a second anti-oxidation electrode layer 184b, which is made of gold (Au) or the like and is disposed on the first anti-oxidation electrode layer 184a.

Here, the first anti-oxidation electrode layer 184a may have a thickness of 400 Å to 600 Å, and the second anti-oxidation electrode layer 184b may have a thickness of 7500 Å to 8500 Å. However, the present disclosure is not limited to the above-mentioned configuration.

The first electrode 170 may have the same structure as the second electrode 180.

Figure 12:
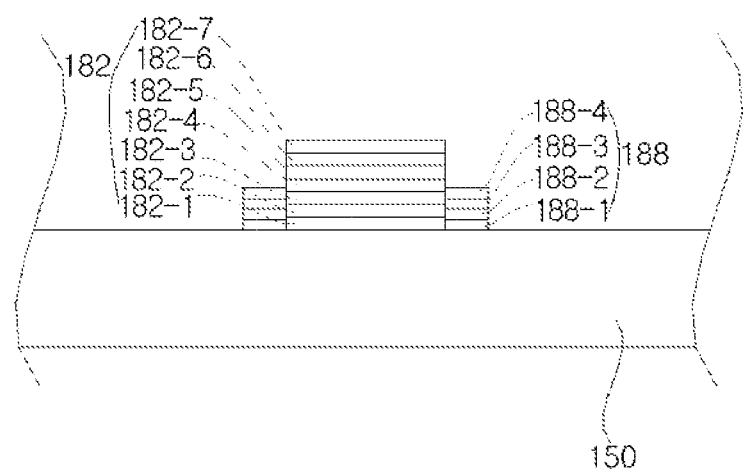
FIG. 12 is a sectional view illustrating an electrode of a light emitting device according to yet another embodiment.

FIG. 12 is a sectional view illustrating an electrode of a light emitting device according to yet another embodiment.

Referring to FIG. 12, a reflective electrode layer 182 may have a multi layer structure, and may have a structure in which, for example, at least an aluminum (Al) layer 182-1, a nickel (Ni) layer 182-2, and a gold (Au) layer 182-3 are laminated in this order. The Al layer 182-1 may be disposed to come into contact with the upper surface of the second semiconductor layer 140. In addition, the reflective electrode layer 182 may have a structure in which the Al layer 182-1, the Ni layer 182-2, and the Au layer 182-3 are laminated in this order, and may further include a chromium (Cr) layer 182-4, an aluminum (Al) layer 182-5, a nickel (Ni) layer 182-6, and a gold (Au) layer 182-7 disposed on the Au layer 182-3. However, the present disclosure is not limited to the above-mentioned configuration.

Although each layer is not limited to a thickness thereof, the Al layer 182-1 may have a thickness of 2800 Å to 3200 Å, the Ni layer 182-2 may have a thickness of 400 Å to 600 Å, the Au layer 182-3 may have a thickness of 7500 Å to 8500 Å, and the Cr layer 182-4 may have a thickness of 15 Å to 25 Å.

A bonding electrode layer 188 may have a multi layer structure, and may have a structure in which, for example, at least a chromium (Cr) layer 188-1, an aluminum (Al) layer 188-2, a nickel (Ni) layer 188-3, and a gold (Au) layer 188-4 are laminated in this order. The Cr layer 188-1 may be disposed to come into contact with the upper surface of the second semiconductor layer 140. Also, the layers may be repeatedly laminated in the above-mentioned order. Although the bonding electrode layer 188 is not limited to a thickness thereof, the Cr layer 188-1 may have a thickness of 15 Å to 25 Å, the Al layer 188-2 may have a thickness of 2800 Å to 3200 Å, the Ni layer 188-3 may have a thickness of 400 Å to 600 Å, and the Au layer 188-4 may have a thickness of 7500 Å to 8500 Å.

Figure 13:
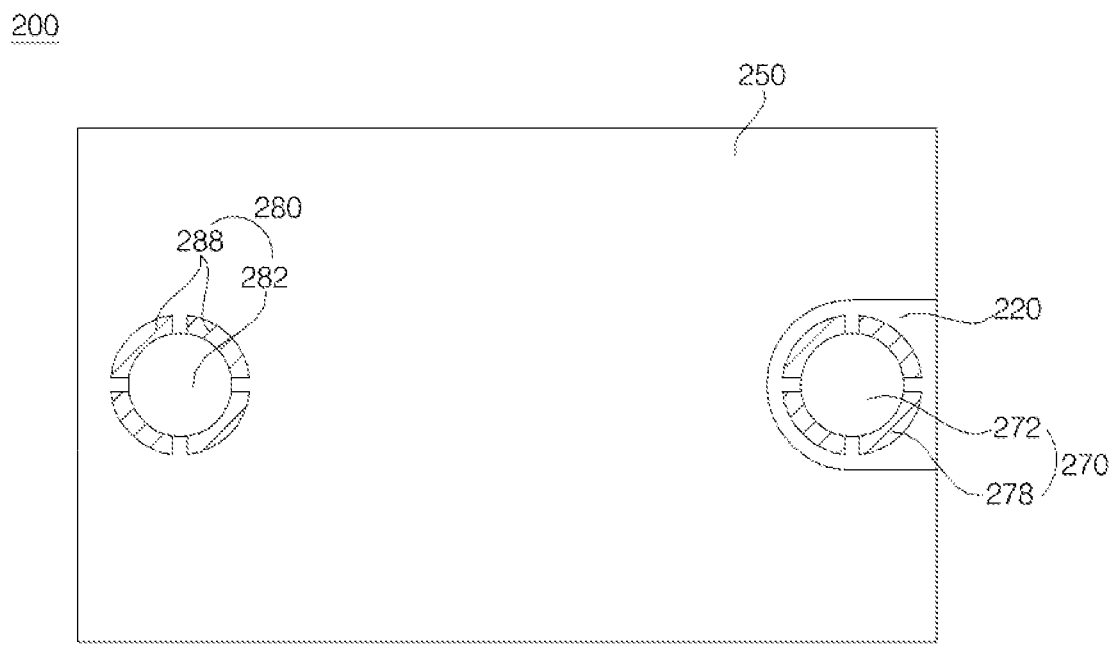
FIG. 13 is a top view illustrating a light emitting device according to yet another embodiment.

FIG. 13 is a top view illustrating a light emitting device according to yet another embodiment.

Referring to FIG. 13, the light emitting device, which is designated by reference numeral 200, according to the illustrated embodiment includes a first electrode 270 and a second electrode 280 having a different structure than the embodiment illustrated in FIG. 1.

The second electrode 280 may include a reflective electrode layer 282 and a bonding electrode layer 288 enclosing a partial region of an outer side surface of the reflective electrode layer 282. Although the bonding electrode layer 288 is illustrated as being divided into four segments in FIG. 13, the present disclosure is not limited thereto. For example, the bonding electrode layer 288 may have a plurality of segments.

The first electrode 270 may have the same structure as the second electrode 280.

Figure 14:
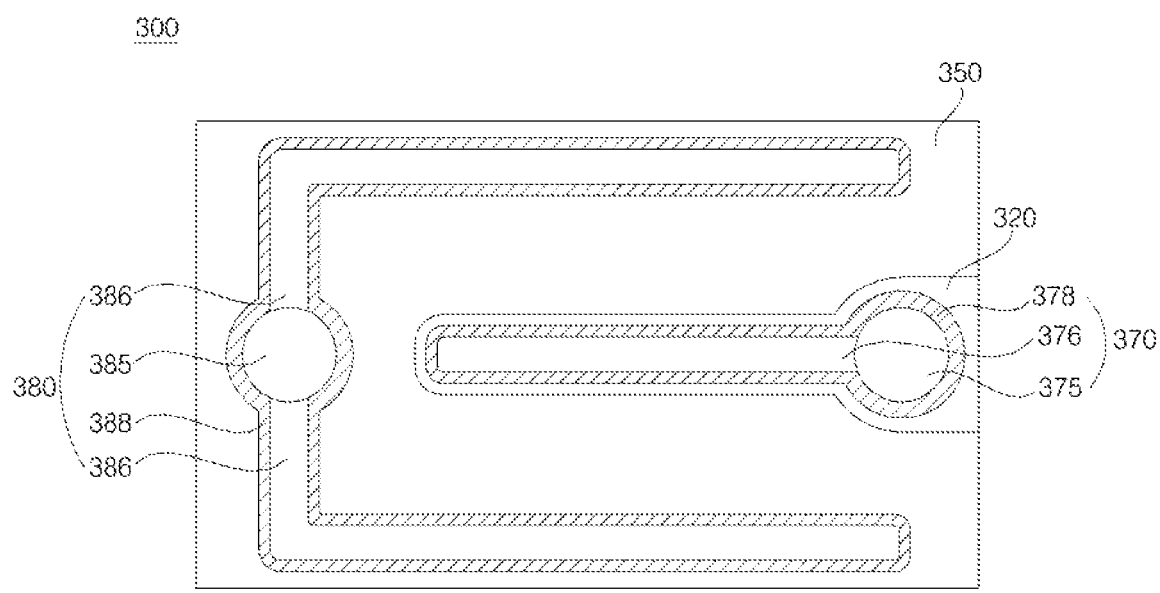
FIG. 14 is a top view illustrating a light emitting device according to yet another embodiment.

FIG. 14 is a top view illustrating a light emitting device according to yet another embodiment.

Referring to FIG. 14, the light emitting device, which is designated by reference numeral 300, according to the illustrated embodiment includes a first electrode 370 and a second electrode 380 having a different structure than the embodiment illustrated in FIG. 1.

The first electrode 370 may include a first electrode pad 375 disposed at one side on a first semiconductor layer 320 and at least one first electrode wing 376 connected to the first electrode pad 375 so as to be disposed at the other side of the first semiconductor layer 320. However, the present disclosure is not limited to the above-mentioned configuration.

The second electrode 380 may include a second electrode pad 385 disposed at one side over a second semiconductor layer 340 and at least one second electrode wing 386 connected to the second electrode pad 385 so as to be disposed at the other side of the second semiconductor layer 340. However, the present disclosure is not limited to the above-mentioned configuration.

Figure 15:
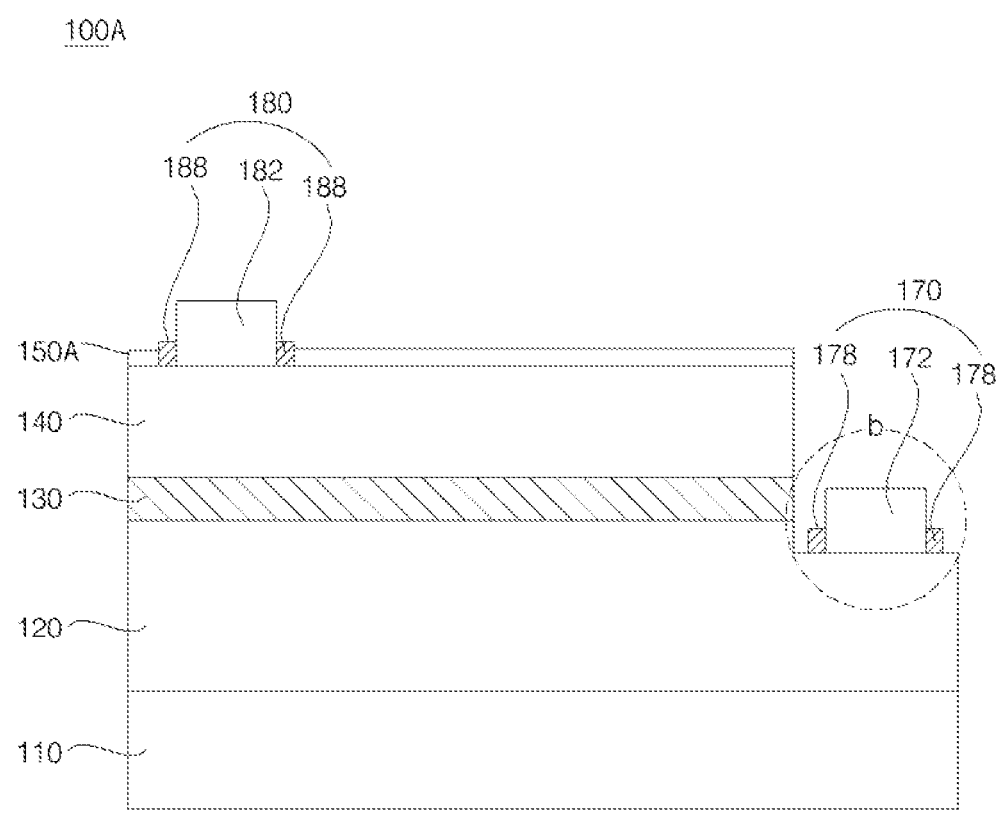
FIG. 15 is a sectional illustrating a light emitting device according to yet another embodiment.

FIG. 15 is a sectional illustrating a light emitting device according to yet another embodiment.

Referring to FIG. 15, the light emitting device, which is designated by reference numeral 100A, according to the illustrated embodiment includes a light transmitting electrode layer 150A having a different structure than the embodiment illustrated in FIG. 2.

The light transmitting electrode layer 150A may include a via hole contacting directly between a second electrode 180 and a second semiconductor layer 140.

Figure 16:
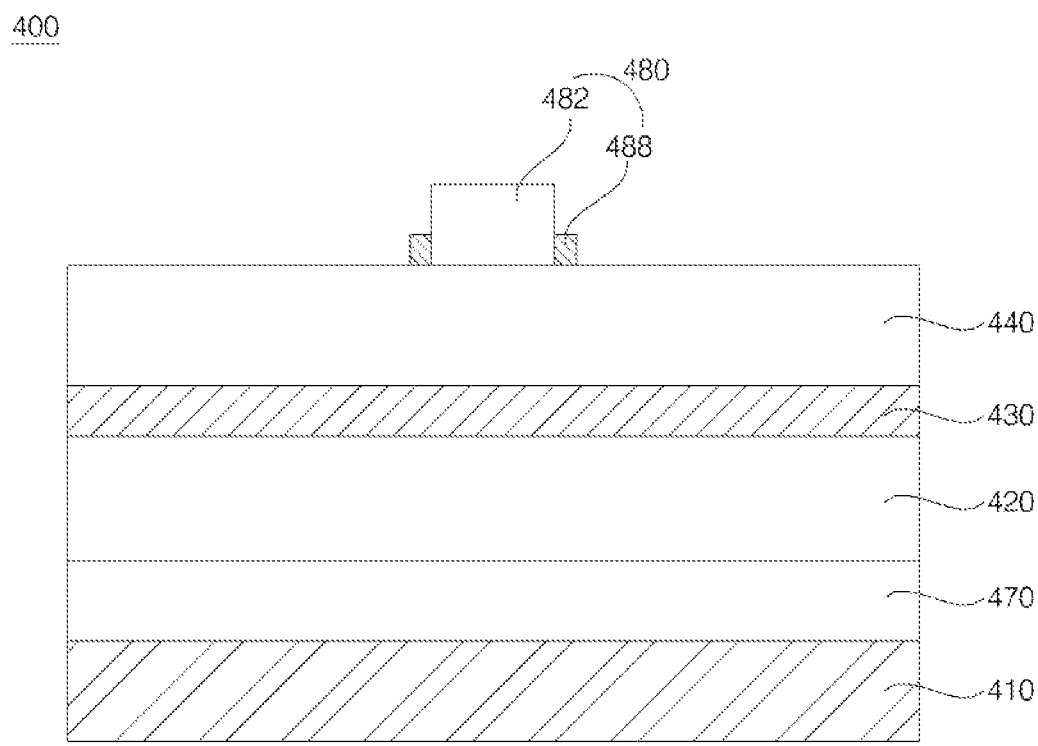
FIG. 16 is a sectional view illustrating a light emitting device according to yet another embodiment.

FIG. 16 is a sectional view illustrating a light emitting device according to yet another embodiment.

Referring to FIG. 16, the light emitting device, which is designated by reference numeral 400, according to the illustrated embodiment may include a support member 410, a light emitting structure including a first electrode layer 470, a first semiconductor layer 420, an active layer 430, and a second semiconductor layer 440, which are disposed over the support member 410, and a second electrode 480.

The support member 410 may be made of a material having superior thermal conductivity, or alternatively made of a conductive material. For example, the support member 410 may be formed using a metal material or conductive ceramics. The support member 410 may have a single layer structure. Alternatively, the support member 410 may have a double layer structure or a multilayer structure having three or more layers.

That is, the support member 410 is made of a metal, for example, any one selected from the group consisting of gold (Au), nickel (Ni), tungsten (W), molybdenum (Mo), copper (Cu), aluminum (Al), tantalum (Ta), silver (Ag), platinum (Pt), and chromium (Cr), or made of an alloy containing two or more materials. Also, the support member 410 may be formed by laminating two or more layers of different materials. Furthermore, the support member 410 may be formed using a carrier wafer, such as Si, Ge, GaAs, ZnO, SiC, SiGe, GaN, or $Ga_2O_3$. Such a support member 410 functions to easily dissipate heat generated from the light emitting device 400, and thus to achieve an enhancement in thermal stability.

Meanwhile, the first electrode layer 470 may be formed on the support member 410. The first electrode layer 470 may include at least one layer of an ohmic layer (not shown), a reflective layer (not shown), and a bonding layer (not shown). Although the first electrode layer 470, for example, may have a structure of ohmic layer/reflective layer/bonding layer, a structure of ohmic layer/reflective layer, or a structure of reflective layer (including ohmic characteristics)/bonding layer, the present disclosure is not limited thereto. For example, the first electrode layer 470 may have a structure in which the reflective layer and the ohmic layer are sequentially laminated over the bonding layer.

The reflective layer (not shown) may be disposed between the ohmic layer (not shown) and the bonding layer (not shown). The reflective layer may be made of a material having high reflective characteristics. The reflective layer may be made of, for example. Ag, Ni, Al, Rh, Pd, Ir, Ru, Mg, Zn, Pt, Au, or Hf, or a selective combination thereof. Alternatively, the reflective layer may be formed to have a multilayer structure, using the metal materials and a light transmitting conductive material such as IZO, IZTO, IAZO, IGZO, IGTO, AZO, ATO, or the like. The reflective layer (not shown) may have a lamination structure of IZO/Ni, AZO/Ag, IZO/Ag/Ni, AZO/Ag/Ni, or the like. When the reflective layer (not shown) is made of a material coming into ohmic contact with the light emitting structure (for example, the first semiconductor layer 420), the ohmic layer (not shown) may not be separately formed, but the present disclosure is not limited thereto.

The ohmic layer (not shown) may come into ohmic contact with a lower surface of the light emitting structure, and be formed to have a layer or a plurality of patterns. For the ohmic layer, a light transmitting electrode layer or a metal may be selectively used. For example, the ohmic layer may be implemented as a single layer structure or a multilayer structure, using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au, and Ni/$IrO_x$/Au/ITO. The ohmic layer (not shown) serves to smoothly inject carriers into the first semiconductor layer 420, but it may not be necessary to form the ohmic layer.

The first electrode layer 470 may include the bonding layer (not shown). In this case, the bonding layer (not shown) may include a barrier metal or a bonding metal. For example, the bonding layer may contain at least one of Ti, Au, Sn, Ni, Cr, Ga, In, Bi, Cu, Ag, and Ta, but the present disclosure is not limited thereto.

The light emitting structure may include at least the first semiconductor layer 420, the active layer 430, and the second semiconductor layer 440. The active layer 430 may be interposed between the first semiconductor layer 420 and the second semiconductor layer 440.

The first semiconductor layer 420 may be formed on the first electrode layer 470. The first semiconductor layer 420 may be implemented as a p-type semiconductor layer doped with a p-type dopant. The p-type semiconductor layer may be made of a semiconductor material having a formula of $In_xAl_yGa_{1-x-y}N$ ($0 \leq x \leq 1$, $0 \leq y \leq 1$, and $0 \leq x+y \leq 1$). For example, the p-type semiconductor layer may be made of a semiconductor material selected from GaN, AlN, AlGaN, InGaN, InN, InAlGaN, AlInN, and the like, and may be doped with a p-type dopant such as Mg, Zn, Ca, Sr, Ba, or the like.

The active layer 430 may be formed on the first semiconductor layer 420. The active layer 430 may be formed to have a single quantum well structure, a multi quantum well (MQW) structure, a quantum wire structure, a quantum dot structure, or the like, using a Group III-V compound semiconductor material.

When the active layer 430 has the quantum well structure, the active layer 430, for example, may have the single or multi quantum well structure, which includes a well layer having a formula of $In_xAl_yGa_{1-x-y}N$ ($0 \leq x \leq 1$, $0 \leq y \leq 1$, and $0 \leq x+y \leq 1$) and a barrier layer having a formula of $In_aAl_bGa_{1-a-b}N$ ($0 \leq a \leq 1$, $0 \leq b \leq 1$, and $0 \leq a+b \leq 1$). The well layer may be made of a material having a band gap smaller than a band gap of the barrier layer.

Also, when the active layer 430 has the multi quantum well structure, each well layer (not shown) may have a different indium (In) content and band gap, and the description thereof will be given with reference to FIGS. 8 to 10 later.

A conductive clad layer (not shown) may be formed over and/or beneath the active layer 430. The conductive clad layer (not shown) may be made of an AlGaN-based semiconductor and have a greater band gap than the active layer 430.

Meanwhile, an intermediate layer (not shown) may be formed between the active layer 430 and the first semiconductor layer 420. The intermediate layer may be an electron blocking layer to prevent electrons injected from the second semiconductor layer 440 to the active layer 430 during application of high current from flowing to the first semiconductor layer 420, without recombination of the electrons in the active layer 430. The intermediate layer (not shown) has a relatively greater band gap than the active layer 430, thereby preventing electrons injected from the second semiconductor layer 440 from being injected into the first semiconductor layer 420, without recombination of the electrons in the active layer 430. Thus, it may be possible to enhance recombination probability between the electrons and the holes in the active layer 430 and to prevent leakage of current.

Here, the intermediate layer may have a greater band gap than the band gap of the barrier layer included in the active layer 430, and be formed as a semiconductor layer containing Al such as AlGaN. However, the intermediate layer is not limited to the above-mentioned configuration.

The second semiconductor layer 440 may be formed on the active layer 430. The second semiconductor layer 440 may be implemented as an n-type semiconductor layer. The n-type semiconductor layer may be made of, for example, a semiconductor material having a formula of $In_xAl_yGa_{1-x-y}N$ ($0 \leq x \leq 1$, $0 \leq y \leq 1$, and $0 \leq x+y \leq 1$). For example, the n-type semiconductor layer may be made of a semiconductor material selected from GaN, AlN, AlGaN, InGaN, InN, InAlGaN, AlInN, and the like, and may be doped with an n-type dopant such as Si, Ge, Sn, or the like.

Meanwhile, the light emitting structure may include a third semiconductor layer (not shown), which is disposed on the second semiconductor layer 440, having an opposite polarity to the second semiconductor layer 440. Alternatively, the first semiconductor layer 420 may be implemented as an n-type semiconductor layer, and the second semiconductor layer 440 may be implemented as a p-type semiconductor layer. Thus, the light emitting structure may have at least one of an n-p junction structure, a p-n junction structure, an n-p-n junction structure, and a p-n-p junction structure.

The light emitting structure may be formed, at an upper portion thereof, with a light extraction structure (not shown).

The light extraction structure may be formed at a partial region of or throughout an upper surface of the second semiconductor layer 440. The light extraction structure may be formed by carrying out an etching process upon at least a partial region of an upper surface of the second semiconductor layer 440 or light transmitting electrode layer (not shown), but the present disclosure is not limited thereto. The etching process may include a wet etching process and/or a dry etching process. According to carrying out the etching process, the upper surface of the second semiconductor layer 440 or light transmitting electrode layer (not shown) may be formed with a roughness having the light extraction structure. The roughness may be irregularly formed in a random size, but the present disclosure is not limited thereto. The roughness refers to an uneven surface, may include at least one of a texture pattern, an irregularity pattern, and an uneven pattern.

The roughness may be formed, at a lateral section thereof, to have various shapes such as a circular prism shape, a polygonal prism shape, a conical prism shape, a polygonal pyramid shape, a truncated conical shape, and a truncated polygonal pyramid shape, and preferably has a conical shape.

The light extraction structure may be formed using a photo electro chemical (PEC) method or the like, but the present disclosure is not limited thereto. Since the light extraction structure is formed at the upper surface of the light transmitting electrode layer (not shown) or second semiconductor layer 440, total reflection of light generated from the active layer 430 is achieved by the upper surface of the light transmitting electrode layer (not shown) or second semiconductor layer 440. Consequently, it may be possible to prevent re-absorption or scattering of light, thereby enhancing light extraction efficiency of the light emitting device 400.

A passivation (not shown) may be formed at a side surface and an upper region of the light emitting structure, and be made of an insulation material.

The second electrode 480, which is electrically connected to the second semiconductor layer 440, may be formed on the second semiconductor layer 440, and include at least one pad and/or an electrode having a predetermined pattern. The second electrode 480 may be disposed at a center region, an outer region, or a corner region of the upper surface of the second semiconductor layer 440, but the present disclosure is not limited thereto. The second electrode 480 may be disposed at a region different from an upper portion of the second semiconductor layer 440, but the present disclosure is not limited thereto.

The second electrode 480 may include a reflective electrode layer 482 disposed over the second semiconductor layer 440, and a bonding electrode layer 488, which is disposed in at least a partial region of an outer side surface of the reflective electrode layer 482 while coming into contact with the second semiconductor layer 440. Here, the configuration of the reflective electrode layer 482 and bonding electrode layer 488 is the same as described above.

Figure 17:
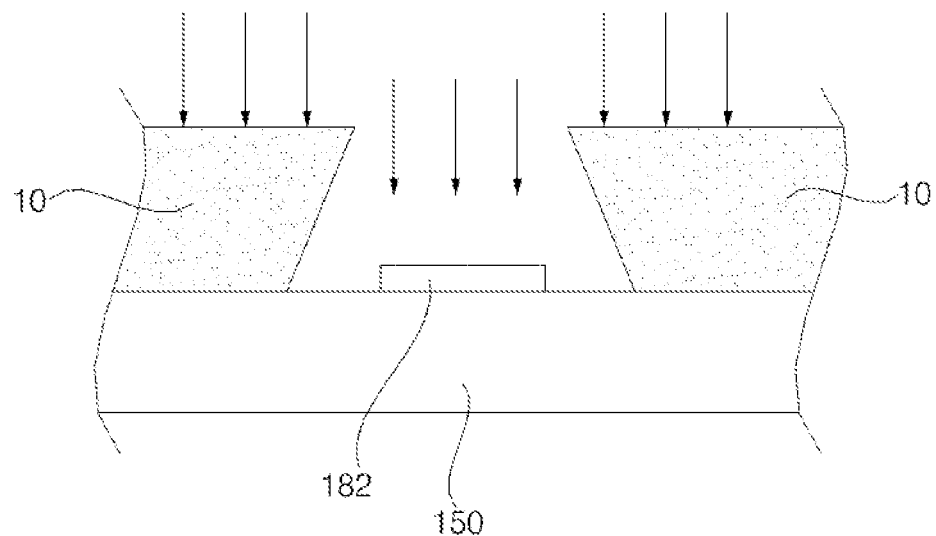
FIGS. 17 to 19 are sectional views illustrating sequential processes of a method for manufacturing the electrode of the light emitting device according to the illustrated embodiment.
Figure 18:
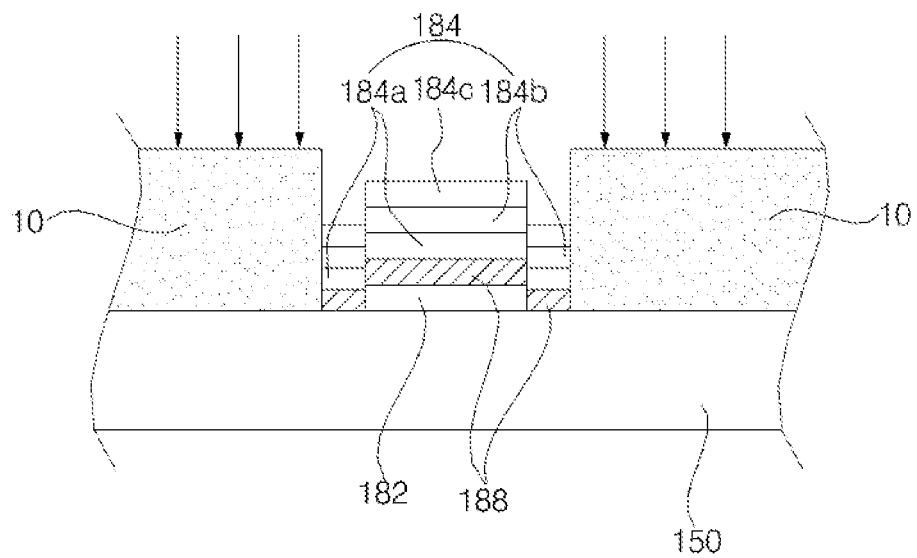
Figure 19:
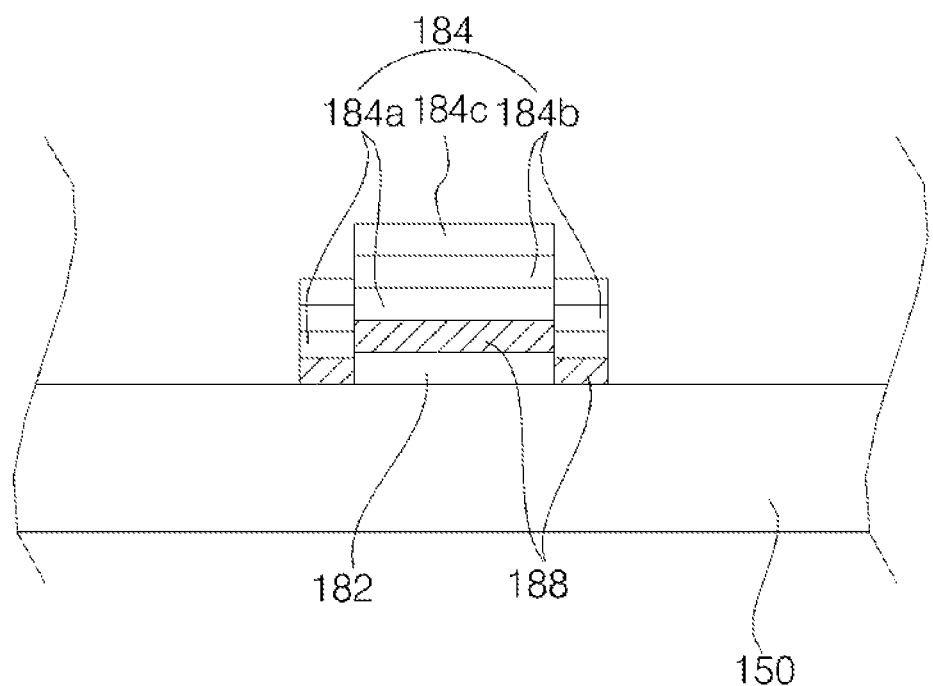

FIGS. 17 to 19 are sectional views illustrating sequential processes of a method for manufacturing the electrode of the light emitting device according to the illustrated embodiment.

Referring to FIG. 17, first, the first semiconductor layer 120, the active layer 130, the second semiconductor layer 140, and the light transmitting electrode layer 150 are grown in this order.

Subsequently, a photo resist (PR) 10 is disposed on the light transmitting electrode layer 150. In this case, the PR 10 may have a decreasing width with decreasing distance to an upward direction, but the present disclosure is not limited thereto.

Thereafter, the reflective electrode layer 182 is laminated.

Referring to FIG. 18, a width wider than that of the reflective electrode layer 182 is secondly created by baking the PR 10 or using another PR.

Subsequently, the bonding electrode layer 188, the first anti-oxidation electrode layer 184*a*, the second anti-oxidation electrode layer 184*b*, and the third anti-oxidation electrode layer 184*c* are laminated in this order. In this case, the bonding electrode layer 188, the first anti-oxidation electrode layer 184*a*, the second anti-oxidation electrode layer 184*b*, and the third anti-oxidation electrode layer 184*c* may also be laminated in this order at the side surface of the reflective electrode layer 182.

Referring to FIG. 19, the PR 10 is subsequently removed.

Although the method for manufacturing the second electrode 180 is described, the first electrode 170 may be manufactured using the same method as the second electrode 180.

Figure 20:
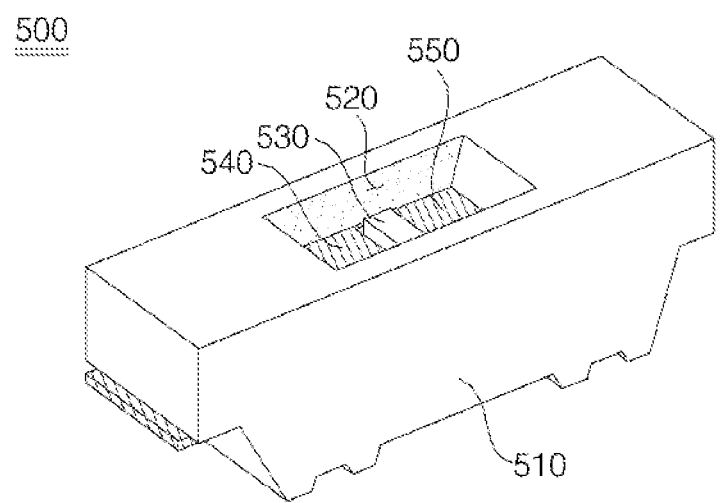
FIG. 20 is a perspective view illustrating a light emitting device package including a light emitting device according to an exemplary embodiment.
Figure 21:
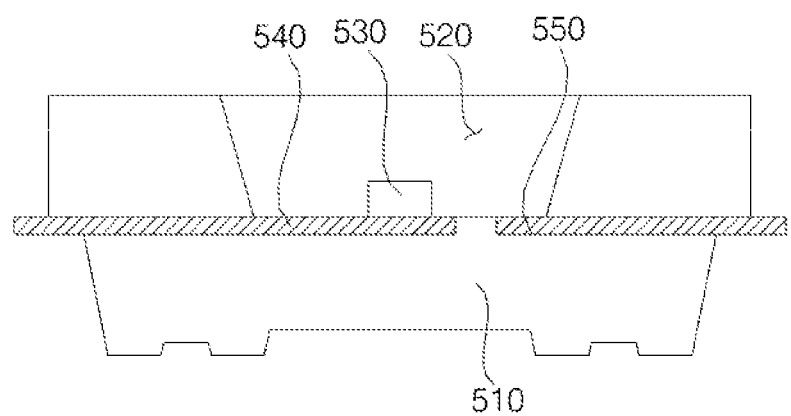
FIG. 21 is a sectional view illustrating the light emitting device package including the light emitting device according to the illustrated exemplary embodiment.

FIG. 20 is a perspective view illustrating a light emitting device package including a light emitting device according to an exemplary embodiment. FIG. 21 is a sectional view illustrating the light emitting device package including the light emitting device according to the illustrated exemplary embodiment.

Referring to FIGS. 19 and 20, the light emitting device package, which is designated by reference numeral 500, may include a body 510 formed with a cavity 520, first and second lead frames 540 and 550 mounted on the body 510, a light emitting device 530 electrically connected to the first and second lead frames 540 and 550, and an encapsulant (not shown) filled in the cavity 520 so as to cover the light emitting device 530.

The body 510 may be made of at least one of a resin material such as polyphthalamide (PPA), silicon (Si), aluminum (Al), aluminum nitride (AlN), liquid crystal polymer such as photo sensitive glass (PSG), polyamide 9T (PA9T), syndiotactic polystyrene (SPS), a metal material, sapphire ($Al_2O_3$), and beryllium oxide (BeO), or may be a Printed Circuit Board (PCB). The body 510 may be formed by an injection molding process, an etching process or the like, but the present disclosure is not limited thereto.

The body 510 may have an inclined surface at an inner surface thereof. In accordance with the inclination of the inclined surface, a reflective angle of light emitted from the light emitting device 530 may be varied. Thus, an orientation angle of outwardly emitted light may be adjusted.

As the orientation angle of light decreases, the convergence of light outwardly emitted from the light emitting device 530 increases. On the other hand, as the orientation angle of light increases, the convergence of light outwardly emitted from the light emitting device 530 decreases.

When viewed from the top, the cavity 520 formed at the body 510 may have a circular, square, polygonal or elliptical shape. In particular, the cavity 520 may have curved corners, but present disclosure is not limited thereto.

The light emitting device 530 is mounted on the first lead frame 540. The light emitting device 530 may be, for example, a light emitting device to emit red, green, blue or white light, or a light emitting device to emit ultraviolet (UV) light, but the present disclosure is not limited thereto. In addition, one or more light emitting devices may be mounted.

The above-mentioned embodiment may be applied to a horizontal type light emitting device having a structure in which electrical terminals of the light emitting device 530 are formed at an upper surface thereof, a vertical type light emitting device having a structure in which electrical terminals of the light emitting device 530 are formed at respective upper and lower surfaces thereof; or a flip chip type light emitting device.

The encapsulant (not shown) may be filled within the cavity 520 to cover the light emitting device 530.

The encapsulant (not shown) may be made of silicon, epoxy resin, or other resin material. The encapsulant may be formed by filling the cavity 520 with an encapsulating material, and curing the filled material using ultraviolet light or heat.

The encapsulant (not shown) may contain a fluorescent substance.

The kind of the fluorescent substance may be selected depending on a wavelength of light emitted from the light emitting device 530 so that the light emitting device package 500 may realize emission of white light.

The fluorescent substance may be any one of a blue, bluish green, green, yellowish green, yellow, yellowish red, orange, and red luminous fluorescent substances depending on the wavelength of light emitted from the light emitting device 530.

That is, the fluorescent substance may be excited by light emitted from the light emitting device 530 at a first wavelength, so as to generate light of a second wavelength. For example, when the light emitting device 530 is a blue light emitting diode and the fluorescent substance is a yellow fluorescent substance, the yellow fluorescent substance is excited by blue light, thereby emitting yellow light. In this case, the light emitting device package 500 may provide white light as the blue light generated from the blue light emitting diode and the yellow light generated in accordance with the excitation by the blue light are mixed.

Similarly, when the light emitting device 530 is a green light emitting diode, a magenta fluorescent substance or a mixture of blue and red fluorescent substances may be used as the fluorescent substance. Also, when the light emitting device 530 is a red light emitting diode, a cyan fluorescent substance or a mixture of blue and green fluorescent substances may be used as the fluorescent substance.

The fluorescent substance may be a known fluorescent substance such as a YAG-based, TAG-based, sulfide-based, silicate-based, aluminate-based, nitride-based, carbide-based, nitridosilicate-based, borate-based, fluoride-based, or phosphate-based fluorescent substance.

The first and second lead frames 540 and 550 may contain at least one of metal materials, for example, titanium (Ti), copper (Cu), nickel (Ni), gold (Au), chromium (Cr), tantalum (Ta), platinum (Pt), tin (Sn), silver (Ag), phosphor (P), aluminum (Al), indium (In), palladium (Pd), cobalt (Co), silicon (Si), germanium (Ge), hafnium (Ht), ruthenium (Ru), and iron (Fe), or an alloy thereof. The first and second lead frames 540 and 550 may also be formed to have a single layer structure or a multilayer structure, but the present disclosure is not limited thereto.

The first and second lead frames 540 and 550 are spaced apart from each other and are electrically isolated from each other. The light emitting device 530 may be mounted on the first and second lead frames 540 and 550. The first and second lead frames 540 and 550 may be electrically connected to each other by directly coming into contact with the light emitting device 530 or through a conductive material such as a soldering member (not shown). Also, the light emitting device 530 may be electrically connected to the first and second lead frames 540 and 550 using a wire bonding method, but the present disclosure is not limited thereto. Accordingly, when a power source is connected to the first and second lead frames 540 and 550, power may be applied to the light emitting device 530. Meanwhile, a plurality of lead frames (not shown) may be mounted within the body 510, and each of the lead frames (not shown) may be electrically connected to the light emitting device 530, but the present disclosure is not limited thereto.

Figure 22:
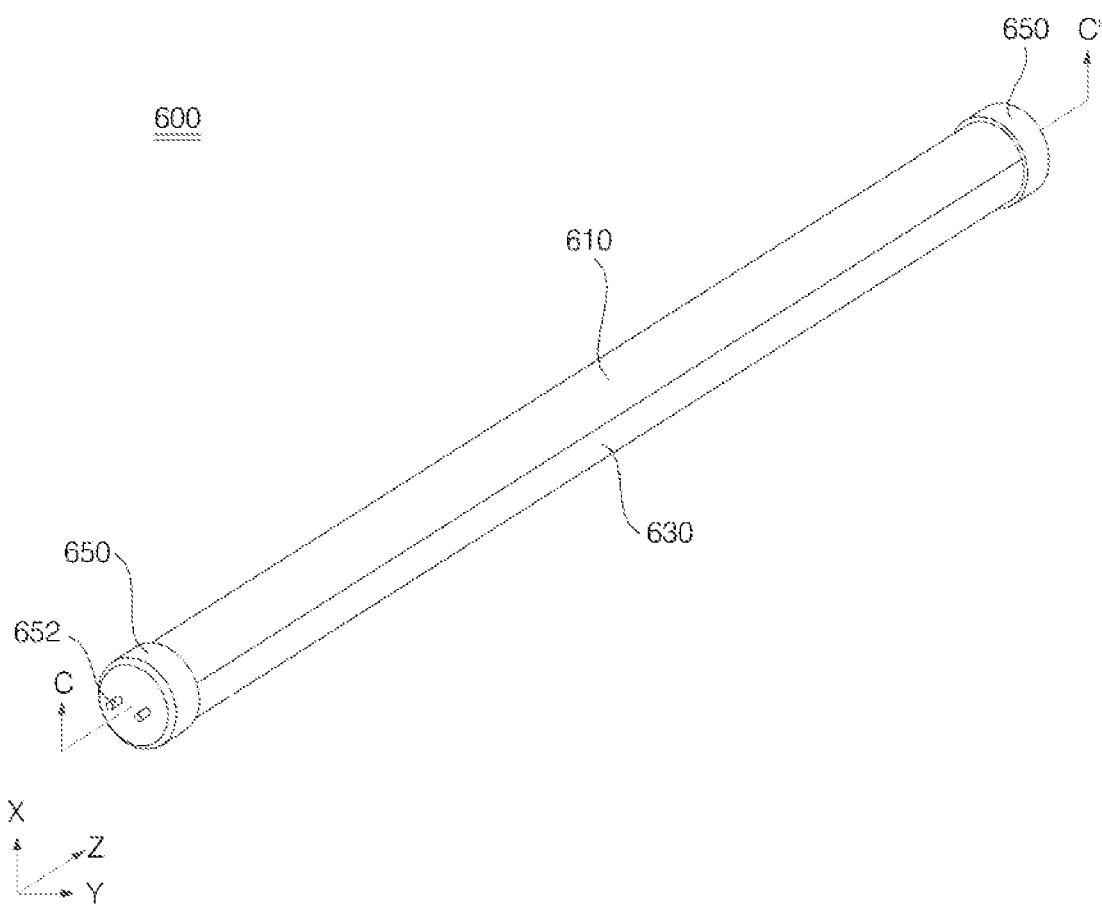
FIG. 22 is a perspective view illustrating a lighting apparatus including a light emitting device according to an exemplary embodiment.
Figure 23:
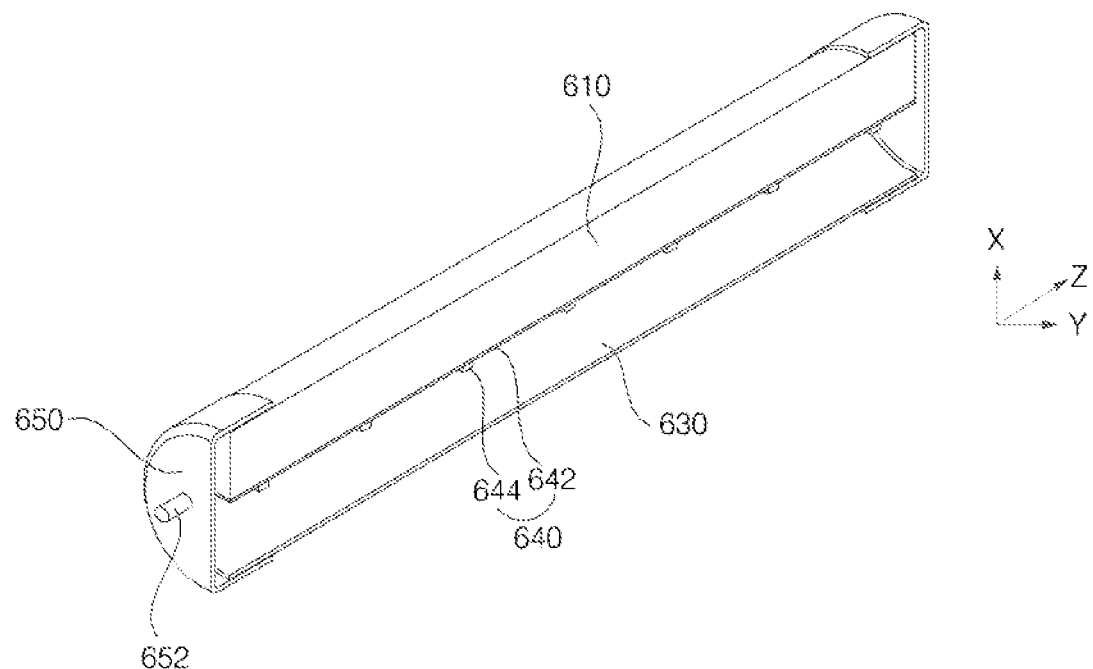
FIG. 23 is a sectional view taken along line C-C' of the lighting apparatus shown in FIG. 22.

FIG. 22 is a perspective view illustrating a lighting apparatus including a light emitting device according to an exemplary embodiment. FIG. 23 is a sectional view taken along line C-C' of the lighting apparatus shown in FIG. 22.

Referring to FIGS. 21 and 22, the lighting apparatus 600 may include a body 610, a cover 630 coupled to the body 610, and end caps 650 located at opposite ends of the body 610.

A light emitting device module 640 is coupled to a lower surface of the body 610. The body 610 may be made of a metal material having superior conductivity and superior heat radiation effects so as to outwardly dissipate heat generated from the light emitting device module 640 through an upper surface of the body 610.

Light emitting device packages 644 may be mounted on a PCB 642 in multiple rows while having various colors, to form a multi-color array. The light emitting device packages 644 may be mounted at the same distance, or may be mounted at different distances to enable brightness adjustment, if necessary. The PCB 642 may be a metal core PCB (MCPCB), a flame retardant-4 (FR4) PCB, or the like.

Each light emitting device package 644 may include an extended lead frame (not shown) so that it may have an enhanced heat dissipation function. Thus, it may be possible to enhance the reliability and efficiency of the light emitting device package 644. In addition, it may be possible to extend the life span of the lighting apparatus 600, which includes the light emitting device packages 644.

The cover 630 may have a circular shape to enclose the lower surface of the body 610, but the present disclosure is not limited thereto.

The cover 630 serves to protect the light emitting device module 640 from external foreign matter, etc. The cover 630 may contain light diffusion particles to achieve anti-glare effects and uniform emission of light generated from the light emitting device packages 644. At least one of inner and outer surfaces of the cover 630 may be provided with a prism pattern. Also, a fluorescent substance may be applied to at least one of the inner and outer surfaces of the cover 630.

Since the light generated from the light emitting device packages 644 is outwardly emitted through the cover 630, the cover 630 should have high light transmittance and heat resistance sufficient to endure heat generated from the light emitting device packages 644. To this end, the cover 630 may be made of polyethylene terephthalate (PET), polycarbonate (PC), polymethyl methacrylate (PMMA), or the like.

The end caps 650 may be disposed at the opposite ends of the body 610, and function to seal a power supply unit (not shown). Each end cap 650 is formed with power pins 652, so that the lighting apparatus 600 according to the illustrated embodiment may be directly connected to a terminal, from which an existing fluorescent lamp has been removed, without an additional connector.

Figure 24:
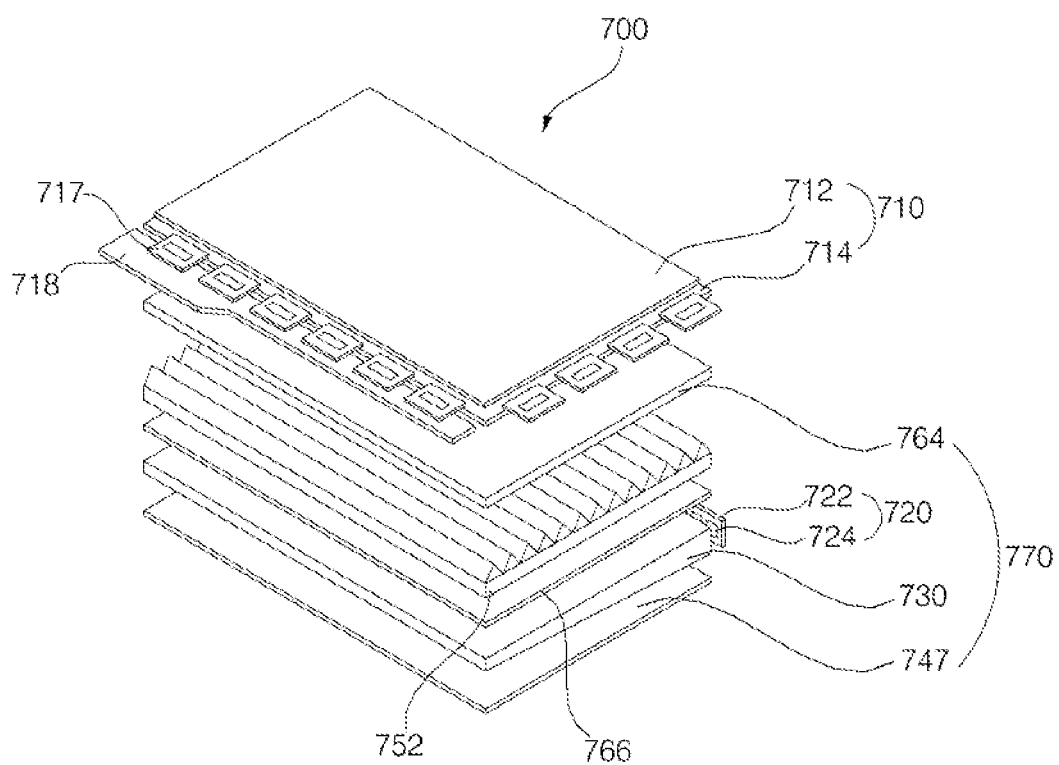
FIG. 24 is an exploded perspective view illustrating a liquid crystal display apparatus including a light emitting device according to an exemplary embodiment.

FIG. 24 is an exploded perspective view illustrating a liquid crystal display apparatus including a light emitting device according to an exemplary embodiment.

FIG. 24 illustrates an edge-light type liquid crystal display apparatus. The liquid crystal display apparatus, which is designated by reference numeral 700, may include a liquid crystal display panel 710 and a backlight unit 770 for supply of light to the liquid crystal display panel 710.

The liquid crystal display panel 710 may display an image using the light supplied from the backlight unit 770. The liquid crystal display panel 710 may include a color filter substrate 712 and a thin film transistor substrate 714, which face each other with liquid crystals interposed therebetween.

The color filter substrate 712 may realize the color of an image displayed through the liquid crystal display panel 710.

The thin film transistor substrate 714 is electrically connected to a printed circuit board (PCB) 718, on which a plurality of circuit elements is mounted, by means of a drive film 717. The thin film transistor substrate 714 may apply drive voltage provided by the PCB 718 to liquid crystals in response to a drive signal transmitted from the PCB 718.

The thin film transistor substrate 714 may include pixel electrodes and thin film transistors in the form of thin films formed on another substrate made of a transparent material such as glass or plastic.

The backlight unit 770 includes a light emitting device module 720 to emit light, a light guide plate 730 to change light emitted from the light emitting device module 720 into planar light and to provide the planar light to the liquid crystal display panel 710, a plurality of films 752, 766 and 764 to enhance uniformity in luminance distribution and vertical light incidence of light emerging from the light guide plate 730, and a reflective sheet 747 to reflect light emitted rearwards from the light guide plate 730 toward the light guide plate 730.

The light emitting device module 720 may include a plurality of light emitting device packages 724 and a PCB 722 on which the plural light emitting device packages 724 are mounted to form an array. In this case, reliability of the bent light emitting device packages 724 mounted on the PCB 722 may be improved.

The backlight unit 770 may include a diffusion film 766 to diffuse light incident thereupon from the light guide plate 730 toward the liquid crystal display panel 710, and a prism film 752 to converge the diffused light so as to enhance vertical light incidence. The backlight unit 770 may further include a protective film 764 to protect the prism film 752.

Figure 25:
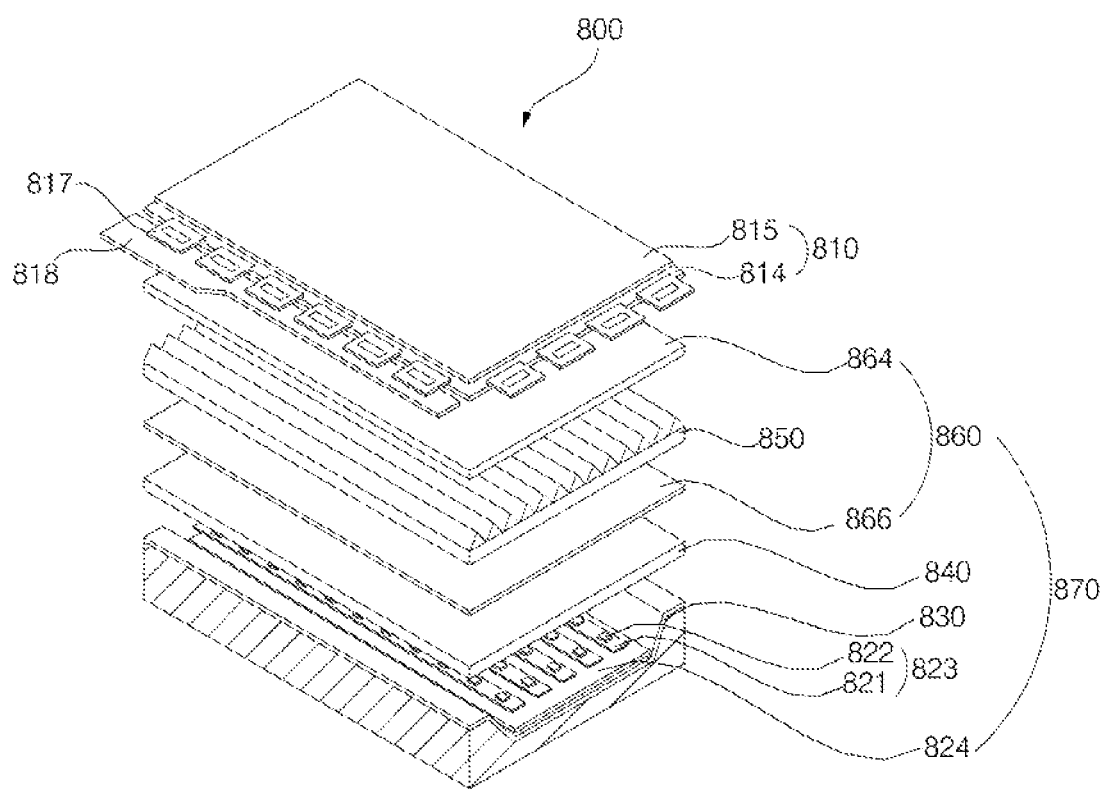
FIG. 25 is an exploded perspective view illustrating a liquid crystal display apparatus including a light emitting device according to an exemplary embodiment.

FIG. 25 is an exploded perspective view illustrating a liquid crystal display apparatus including a light emitting device according to an exemplary embodiment. Here, the same configuration as that illustrated in FIG. 24 will not be repeatedly described in detail.

FIG. 25 illustrates a direct type liquid crystal display apparatus. The liquid crystal display apparatus, which is designated by reference numeral 800, may include a liquid crystal display panel 810 and a backlight unit 870 for supply of light to the liquid crystal display panel 810.

Since the liquid crystal display panel 810 is similar to that of FIG. 24, no detailed description thereof will be given.

The backlight unit 870 may include a plurality of light emitting device modules 823, a reflective sheet 824, a lower chassis 830 in which the light emitting device modules 823 and reflective sheet 824 are accommodated, a diffusion plate 840, and a plurality of optical films 860, the diffusion plate 840 and the optical films 860 being disposed over the light emitting device modules 823.

Each light emitting device module 823 may include a plurality of light emitting device packages 822, and a PCB 821 on which the plural light emitting device packages 822 are mounted to form an array.

The reflective sheet 824 reflects light generated by the light emitting device packages 822 toward the liquid crystal display panel 810, thereby achieving an enhancement in light utilization efficiency.

Meanwhile, the light generated from the light emitting device modules 823 is incident upon the diffusion plate 840. The optical films 860 are disposed over the diffusion plate 840. The optical films 860 may be comprised of a diffusion film 866, a prism film 850 and a protective film 864.

As is apparent from the above description, a light emitting device includes an electrode, which has a superior bonding property to a semiconductor layer and has high light reflectivity, and thus it may be possible to enhance luminous efficiency and prevent peeling-off of the electrode from the semiconductor layer.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device comprising: a light emitting structure comprising a first semiconductor layer, a second semiconductor layer, and an active layer between the first and second semiconductor layers; a first electrode electrically connected to the first semiconductor layer; and a second electrode disposed on the second semiconductor layer, wherein the second electrode comprises: a reflective layer disposed on the second semiconductor layer; a metal layer disposed on a side surface of the reflective layer and on a top surface of reflective layer, wherein the metal layer has a first layer, and a second layer on the first layer, wherein the first layer is contacted with an upper surface of the second semiconductor layer, wherein the first layer contains chromium (Cr), and the second layer contains aluminum (Al); a first anti-oxidation layer formed only on an upper surface of the metal layer; and a second anti-oxidation layer formed only on an upper surface of the first anti-oxidation layer, wherein the second anti-oxidation layer is more than 10 times thicker than the first anti-oxidation layer.

2. The light emitting device according to claim 1, wherein the first anti-oxidation layer and second anti-oxidation layer comprise at least one of gold (Au), rhodium (Rh), palladium (Pd), copper (Cu), nickel (Ni), ruthenium (Ru), iridium (Ir), and platinum (Pt).

3. The light emitting device according to claim 1, wherein the first anti-oxidation layer is made of nickel (Ni).

4. The light emitting device according to claim 3, wherein the second anti-oxidation layer is made of gold (Au).

5. The light emitting device according to claim 1, wherein the first anti-oxidation layer has a thickness of 400 Å to 600 Å.

6. The light emitting device according to claim 5, wherein the second anti-oxidation layer has a thickness of 7500 Å to 8500 Å.

7. The light emitting device according to claim 1, wherein the reflective layer has a multi layer structure including a silver (Ag).

8. A light emitting device comprising: a light emitting structure comprising a first semiconductor layer, a second semiconductor layer, and an active layer between the first and second semiconductor layers; a first electrode electrically connected to the first semiconductor layer; and a second electrode disposed on the second semiconductor layer, wherein the second electrode comprises: a reflective layer disposed on the second semiconductor layer; a metal layer disposed on a side surface of the reflective layer and on a top surface of reflective layer; and an anti-oxidation layer formed only on an upper surface of the metal layer, wherein the reflective layer has a multi layer structure including a silver (Ag), wherein the metal layer has a chromium (Cr) layer, an aluminum (Al) layer, and wherein the Cr layer is contacted with an upper surface of the second semiconductor layer, wherein the chromium (Cr) layer, the aluminum (Al) layer are laminated in this order.

9. The light emitting device according to claim 8, wherein the Cr layer has a thickness of 15 Å to 25 Å.

10. The light emitting device according to claim 9, wherein the Al layer has a thickness of 2800 Å to 3200 Å.

11. The light emitting device according to claim 8, wherein the anti-oxidation electrode layer comprises at least one of gold (Au), rhodium (Rh), palladium (Pd), copper (Cu), nickel (Ni), ruthenium (Ru), iridium (Ir), and platinum (Pt).

12. A light emitting device comprising:
a light emitting structure comprising a first semiconductor layer, a second semiconductor layer, and an active layer between the first and second semiconductor layers; a first electrode electrically connected to the first semiconductor layer; and a second electrode disposed on the second semiconductor layer, wherein the second electrode comprises: a reflective layer disposed on the second semiconductor layer; a metal layer disposed on a side surface of the reflective layer and on a top surface of reflective layer; a first anti-oxidation layer formed only on an upper surface of the metal layer; and a second anti-oxidation layer formed only on an upper surface of the first anti-oxidation layer, wherein the second anti-oxidation layer is more than 10 times thicker than the first anti-oxidation layer, wherein the reflective layer has a multi layer structure including a silver (Ag), wherein the metal layer has a first layer, and a second layer on the first layer, wherein the first layer is contacted with an upper surface of the second semiconductor layer, wherein the first layer contains chromium (Cr), and the second layer contains aluminum (Al), wherein the second electrode is disposed on a part of the second semiconductor layer, and wherein an area of a top surface of the second semiconductor layer is 2 times larger than that of a top surface of the second electrode.

13. The light emitting device according to claim 12, wherein the first anti-oxidation layer and the second anti-oxidation layer comprise at least one of gold (Au), rhodium (Rh), palladium (Pd), copper (Cu), nickel (Ni), ruthenium (Ru), iridium (Ir), and platinum (Pt).

14. The light emitting device according to claim 12, wherein the first anti-oxidation layer is made of nickel (Ni).

15. The light emitting device according to claim 14, wherein the second anti-oxidation layer is made of gold (Au).

16. The light emitting device according to claim 12, wherein the first anti-oxidation layer has a thickness of 400 Å to 600 Å.

17. The light emitting device according to claim 16, wherein the second anti-oxidation layer has a thickness of 7500 Å to 8500 Å.

* * * * *